United States Patent
Raman et al.

(10) Patent No.: US 10,698,009 B2
(45) Date of Patent: Jun. 30, 2020

(54) METHOD AND CIRCUIT FOR BIASING AND READOUT OF RESISTIVE SENSOR STRUCTURE

(71) Applicant: Melexis Technologies SA, Bevaix (CH)

(72) Inventors: Johan L. Raman, Knesselare (BE); Pieter Rombouts, Mariakerke (BE)

(73) Assignee: Melexis Technologies SA, Bevaix (CH)

( * ) Notice: Subject to any disclaimer, the term of this patent is extended or adjusted under 35 U.S.C. 154(b) by 209 days.

(21) Appl. No.: 15/886,046

(22) Filed: Feb. 1, 2018

(65) Prior Publication Data

US 2018/0224484 A1   Aug. 9, 2018

(30) Foreign Application Priority Data

Feb. 6, 2017   (EP) .................... 17154758

(51) Int. Cl.
*G01R 19/25*   (2006.01)
*G01R 27/02*   (2006.01)
(Continued)

(52) U.S. Cl.
CPC ......... *G01R 19/2506* (2013.01); *G01D 5/145* (2013.01); *G01D 5/24476* (2013.01);
(Continued)

(58) Field of Classification Search
CPC .... G01R 19/2506; G01R 27/14; G01R 33/07; G01R 27/02; G01R 15/202; G01R 17/105;
(Continued)

(56) References Cited

U.S. PATENT DOCUMENTS 9,214,931 B2 * 12/2015 Lin ...................... H03K 5/2481
2006/0176074 A1 * 8/2006 Van Epps .......... G01R 1/06766
326/30
(Continued)

FOREIGN PATENT DOCUMENTS

EP   0736756 A1   10/1996
EP   2722682 A1    4/2014
(Continued)

OTHER PUBLICATIONS

European Search Report from EP Application No. 17154758.1, dated Jul. 18, 2017.

*Primary Examiner* — Christopher P Mcandrew
*Assistant Examiner* — Zannatul Ferdous
(74) *Attorney, Agent, or Firm* — Workman Nydegger

(57) ABSTRACT

A method of biasing and reading-out a passive resistive sensor structure having two excitation nodes and two readout nodes, comprises the steps of: a) determining a first state of a first capacitor corresponding to a first amount of charge biasing the sensor structure such that a biasing current flows through said first capacitor during a first time interval determining a second state of the first capacitor corresponding to a second amount of charge integrating or averaging the readout signal during a second time interval related to the first time interval, thereby obtaining an integrated or averaged readout signal determining the sensor readout signal based on the integrated or averaged readout signal and a change in state of the first capacitor.

19 Claims, 9 Drawing Sheets

(51) Int. Cl.
  *G01D 5/14* (2006.01)
  *G01R 33/07* (2006.01)
  *G01D 5/244* (2006.01)
  *G01R 27/14* (2006.01)
  *G01R 17/10* (2006.01)
  *G01R 15/20* (2006.01)

(52) U.S. Cl.
  CPC .............. *G01R 27/02* (2013.01); *G01R 27/14* (2013.01); *G01R 33/07* (2013.01); *G01R 15/202* (2013.01); *G01R 17/105* (2013.01)

(58) Field of Classification Search
  CPC ...... G01D 5/24476; G01D 5/145; G01D 5/16; G01D 5/142
  See application file for complete search history.

(56) References Cited

U.S. PATENT DOCUMENTS

| | | |
|---|---|---|
| 2012/0153945 A1 | 6/2012 | Ezekwe |
| 2016/0252559 A1* | 9/2016 | Tamura ................ G01R 31/028 324/548 |
| 2017/0086702 A1* | 3/2017 | Kim ....................... G01R 27/14 |

FOREIGN PATENT DOCUMENTS

| | | |
|---|---|---|
| EP | 2728369 A1 | 5/2014 |
| EP | 3032235 A1 | 6/2016 |
| EP | 3109658 A1 | 12/2016 |
| EP | 3193446 A1 | 1/2017 |
| GB | 1547592 A | 6/1979 |
| GB | 1600774.2 | 1/2016 |
| WO | 9854547 A1 | 12/1998 |
| WO | 2015131209 A2 | 9/2015 |

* cited by examiner (prior art)

$$V_{low} = V_{ex} - V_{high}$$

METHOD AND CIRCUIT FOR BIASING AND READOUT OF RESISTIVE SENSOR STRUCTURE

FIELD OF THE INVENTION

The present invention relates in general to the field of sensors, and more in particular to circuits and methods for biasing and for reading out a resistive sensor structure, such as for example a Wheatstone bridge or a Hall element.

BACKGROUND OF THE INVENTION

Resistive sensor structures are known in the art. Two well-known examples are: a Wheatstone bridge and a Hall element.

Wheatstone bridges are used for example in pressure sensors, and the basic principles of using piezo-resistive elements and circuits for biasing and reading the bridge structure are known in the art for many decades, see for example GB1547592 (published in 1979).

Hall elements for measuring a magnetic field are also very well known, and are used inter alia in current sensors, or in angular position sensors, where a magnetic field (e.g. generated by a permanent magnet) is measured at several locations of the sensor device, and is converted into an angular position, as described for example in WO9854547 (published in 1998).

However, Wheatstone bridges and Hall elements are passive resistive structures, and need to conduct a current before an output-signal can be retrieved from them. The term "biasing" is used for applying a voltage or current to such a structure. The term "readout" is used for retrieving a sensor signal or a sensor value from such a structure.

In both cases the "direct output signal" of the passive resistive structure is a differential voltage signal $\Delta V$, but for the examples given above, the actual physical value to be measured is "a pressure" and "an angular position". This requires another conversion step, which may involve a multiplication with a constant factor in case of a pressure sensor, and/or may involve measurement of two or more magnetic field values, and goniometric operations, for example. Such conversions are known in the art, but not the focus of the present invention, and hence will not be further discussed herein.

The present invention is concerned with obtaining accurate values from the passive resistive sensor structures. One problem with passive resistive structures is known as "zero offset". This problem is addressed in the field inter alia by a technique known as "chopping" if the DC value of the sensor signal is not relevant, and in the case of Hall elements, by a technique known as "spinning current". But these techniques do not solve all inaccuracies, in particular problems related to mechanical stress and/or temperature variations and/or due to voltage variations.

In order to better understand and appreciate the present invention, first the classical ways of biasing and reading out a Hall element will be described referring to FIG. 1(a) to FIG. 1(f), and for a Wheatstone bridge with reference to FIG. 2.

A basic Hall element (also referred to as "Hall plate") consist of a conducting material provided with at least four electrical contacts. In order to make use of the "Hall effect", a current has to flow through the element. A bias current I is supplied via two of the contacts, which will be referred to as the "current nodes" or "excitation nodes" or "input nodes". Two other contacts, referred to as the "sense contacts" or "readout nodes" or "output nodes", are typically placed on an equipotential line, to make the voltage difference between the sense contacts zero in the absence of a magnetic field. The principle of measuring a magnetic field component Bz using a horizontal Hall element is illustrated in FIG. 1(a). For a Hall readout, the current contacts A, C and sense contacts B, D alternate with each other. If an excitation current Iex is applied to the current contacts A, C, and if an out-of-plane magnetic field Bz is applied to the element, a Hall voltage VH proportional to the applied magnetic field Bz will appear between the sense contacts B, D; in other words, VH=VB−VD.

There are two common approaches for realizing the biasing current. One approach uses a current source, in which case the nominal value of the applied current I is known (I=Iex). A possible implementation of this case is shown in FIG. 1(b). The other approach uses a voltage source, in which case the nominal voltage over the plate is known (V=Vex). An implementation of this type is shown in FIG. 1(c). It is to be noted that, where in the above the nominal value of the bias source is said to be known, the actual value deviates from this nominal (or expected) value through various mechanisms. This can be due to ageing, or due to environmental influences such as temperature dependencies, parasitic stress (e.g. from the package), etc. Considered over the lifetime of a sensor, the bias source parameters drift from their expected (nominal) value.

When applying "current-biasing", the voltage over the plate is not exactly known, but depends on the electrical resistance of the plate. In the case of "voltage-biasing", the current flowing through the plate is not exactly known, but is determined by the electrical resistance of the plate. This electrical resistance of the Hall plate varies with temperature and stress (e.g. through piezo-resistive effects), and constitutes another source of drift. The sensor resistance also affects the dynamic response of the sensor structure to changes in the applied biasing, as is needed when applying the "spinning current technique".

FIG. 2 shows a biasing circuit connected to a Wheatstone-bridge. In the example shown, the biasing circuit applies a constant voltage Vdd to the excitation nodes A, C. In a manner similar to FIG. 1, the differential output ΔVout of the bridge can be measured over the output nodes B, D. While not shown in FIG. 2, it is also possible to inject a constant current to the excitation nodes A, C, and to readout the voltage Vout over the nodes D, B. The real sensor signal, meaning the value to be actually measured by the sensor structure, for example pressure exerted on a membrane, is then a function of the output signal ΔVout and Vdd, but also of other factors such as temperature, package stress etc. While the relation between the output voltage ΔVout of the sensor structure and the actual physical signal to be measured (e.g. pressure) can be approximated very well by a linear relation, using a constant factor known as "sensitivity of the sensor", in practice the sensitivity is not exactly constant, and needs to be corrected for temperature variations and/or packaging stress.

For the considered sensors, drift of the biasing source causes drift in the sensitivity of the sensor. For a Hall sensor, also piezo-resistive effects of the sensor structure itself may be a source of drift. The total drift of a sensor needs to be kept within bounds over its lifetime, which may require compensation.

Sensors with a Wheatstone bridge are still being developed in recent years, but the focus has shifted to more accurate sensors, for example sensors having a reduced sensitivity to stress and/or temperature, for example as described in EP0736756 (published in 1996) focusing mainly on a special arrangement of the piezo-resistive elements, or in EP3032235 (published in 2016) focusing on both a special arrangement of the piezo-resistive elements and on the biasing circuit.

Likewise, sensors with one or more Hall elements are still being designed in recent years, and also for this type of sensors, large efforts are done to improve accuracy and to make the sensitivity less dependent on external influences. One problem with Hall elements, known as "offset-error, is being addressed by the well-known and widespread "spinning current technique", but significant efforts are being made to reduce also other influences, in particular stress and temperature influences, as described for example in EP3109658 (published 28 Dec. 2016).

SUMMARY OF THE INVENTION

It is an object of the present invention to provide methods and a circuit for biasing and reading out a resistive sensor structure, for example a Wheatstone-bridge or a Hall element.

It is a particular object of embodiments of the present invention to provide such a method and circuit that is capable of biasing and reading out a resistive sensor structure to obtain a result that is more accurate and/or less sensitive to at least some external influences, in particular to parasitic mechanical stress (e.g. package stress) and/or temperature variations.

It is a particular object of embodiments of the present invention to provide such a method and circuit where the requirements for the biasing circuit in terms of long-term stability and independence of temperature and/or stress variations, can be relaxed.

These and other objectives are accomplished by a method and circuit according to embodiments of the present invention.

In a first aspect, the present invention provides a method of biasing a resistive sensor structure and of obtaining a sensor readout signal or sensor readout value from said sensor structure, the resistive sensor structure comprising two excitation nodes and two readout nodes, and being adapted for providing a momentary readout signal at its readout nodes when being biased at its excitation nodes by a biasing circuit; the method comprising the steps of: a) setting or measuring or detecting a first state of a first capacitor, the first state corresponding to a first amount of charge; b) biasing the resistive sensor structure by means of a biasing circuit comprising said first capacitor so as to allow or to force a biasing current through said first capacitor and through said resistive sensor structure during a first time interval; the biasing current may flow simultaneously or at a different moment in time through said first capacitor and through said resistive sensor structure during the first time interval; c) determining or measuring or detecting a second state of the first capacitor at the end of the first time interval, the second state corresponding to a second amount of charge; d) integrating or averaging the momentary readout signal over the readout nodes during a second time interval having a predefined relation with respect to the first time interval, thereby obtaining an integrated or averaged readout signal; e) determining the sensor readout signal or the sensor readout value based on the integrated or averaged readout signal and on a change in state of at least the first capacitor wherein the change in state is related to the difference in charge between the first state and the second state of at least the first capacitor C1.

"Integrating or averaging" in step d) may mean "integrating or averaging in the continuous time".

In the prior art, there are two major causes of inaccuracy of such measurements: (1) a first one related to biasing inaccuracies, due to temperature and stress variations (e.g. ageing or long term drift effects) of the biasing source, e.g. current source or voltage source, and (2) a second one due to temperature and stress variations of the resistive structure itself. The first and second inaccuracy can, and typically are addressed separately in the prior art. The present invention focuses mainly on the first inaccuracy, related to the biasing circuit. Any known technique for compensating or reducing the second inaccuracy can be used in combination with the present invention.

Whereas many prior art solutions try to reduce or eliminate temperature and/or stress influences of the biasing source (e.g. current source or voltage source) as much as possible, and try to obtain a "perfectly constant" current or voltage over time, under various temperatures and stress conditions, the present invention takes a radically different approach, and does not require the biasing current or biasing voltage to be "perfectly constant" over time, independent of temperature and/or stress, and even does not require the biasing current or biasing voltage to be constant at all, not even during a single measurement, which is made possible by using a continuous-time integrating or averaging circuit.

It is an advantage of the present invention that the readout signal or the readout value becomes less dependent on stress and temperature influences of the biasing source.

The first time interval and the second time interval can have the same start and end, and thus coincide in absolute time, or can be different time intervals in absolute time but having the same duration, or can have a first duration and a second duration having a predefined ratio "R".

"Setting a state of the capacitor" can mean for example "imposing a voltage" on the capacitor. It is well known that the voltage over the capacitor and the charge stored on the capacitor are directly linked to each other by the formula: C=Q/V, C being the "capacity" of the capacitor.

The method is ideally suited for measuring the value of a passive resistive sensor structure such as for example a Hall element or a Wheatstone-bridge (e.g. comprising one or more piezo-resistive elements).

It is an advantage of this method that when the duration of biasing in step b) (when determining Qbias) and the duration of integration of the differential output signal is taken equal, the absolute duration of the measurement is not important.

A key difference with existing methods is that the sensor readout signal or sensor readout value is not determined or calculated based on a fixed (nominal) current value (with the real current being sensitive to stress and/or temperature variations) or a fixed (nominal) voltage value (with the real voltage being sensitive to stress and/or temperature variations), but is based on an actual amount of charge that has actually flowed through the sensor structure.

Another key aspect is that the resulting sensor output is integrated and amplified in continuous-time while the biasing current is flowing through the sensor structure. This offers an additional filtering effect, which improves the Signal-to-Noise Ratio, and thus the accuracy of the measurement.

It is an advantage of this method that it allows to measure the sensor readout signal in a manner which is highly insensitive to bias source drift, as caused for instance by stress and temperature variations. This allows the use of a current source or voltage source with a relatively large sensitivity to temperature and/or mechanical stress, as opposed to many prior art circuits, requiring a highly "constant" and "stable" current or voltage, with a value that is as much as possible "constant" over time, irrespective of temperature, mechanical stress and ageing effects. Thus, the biasing circuit of the present invention may be less complex than that of some prior art solutions, or uses a completely different approach to solve this problem.

It is an advantage of using a capacitor because it allows the total amount of charge that flowed through the resistive structure can relatively easily be determined, for example by measuring the amount of charge stored on the capacitor before the actual measurement and after the actual measurement, e.g. by measuring the voltage over the capacitor before and after the integration period, or even without measuring the voltage, but by setting the voltage at the start of the time interval, and by stopping the discharge and integration triggered by a comparator adapted for checking whether the voltage over the capacitor has reached a certain threshold.

Particular advantages of the method are: (i) low-noise readout (mainly related to the continuous-time integration), especially if an integration-based low-noise amplifier is used, (ii) the design of the bias source becomes less critical since more cross-sensitivity to temperature and/or stress can be tolerated without degrading sensor performance, and (iii) that the sensor readout signal or sensor readout value is highly insensitive to drift in the (absolute) time periods.

In an embodiment, the method further comprises a step of: correcting the sensor readout signal or sensor readout value for temperature variations of the resistive structure and/or stress exerted upon the resistive structure. Any known correction technique can be used, for example a technique where the circuit further comprises a temperature sensor and a mechanical stress sensor, and the method further comprises obtaining a temperature and stress value from said sensors, and step e) further comprises taking into account said temperature value and said stress value.

While biasing and readout circuits using a temperature sensor and a stress sensor already exist, as far as is known to the inventors, such circuits do not use the method as described herein, which further improves the accuracy of the readout signals, by not having to compensate for temperature and stress effects on the biasing circuit, only on the resistive structure.

In an embodiment, the first time interval coincides with the second time interval;

This is a special case wherein step b) of biasing and step d) of integrating or averaging occurs at the same time, thus the integration or averaging is done while, and for as long as the biasing takes place, and with the exact biasing current also flowing through C1. This method is the easiest to understand conceptually, and boils down to determining the readout signal "normalized with Qbias", as a way to take into account temperature and/or stress effects of the biasing circuit.

In an embodiment, the first time interval and the second time interval have a same duration but a start of the second time interval occurs later than an end of the first time interval;

This is a special case wherein step b) occurs first, for example for determining the first and second state of the first capacitor, optionally without reading out the signal, and wherein step d) is performed later in time, using the same biasing conditions and for the same duration but without determining the first and second state of the first capacitor (which is already known), while integrating or averaging the readout signal.

In an embodiment, a ratio of the second duration and the first duration is a predefined integer value larger than 1, and wherein step e) comprises determining the sensor readout signal or sensor readout value further taking into account said predefined ratio.

This is a special case wherein the integration or averaging occurs over multiple time intervals, for example over two time intervals, preferably without resetting the integrating circuit or averaging circuit in between.

In an embodiment, the first time interval has a predefined first duration, and wherein the second time interval has a predefined second duration.

The duration of the time interval can be a predefined fixed duration, for example set by a timer or counter unit. Such embodiment is referred to herein as "fixed time mode", examples of which are shown in FIG. 6, and FIG. 7(*a*).

In an embodiment, the first time interval has a predefined start moment but a dynamically determined end moment defined as the moment at which a voltage over the first capacitor is equal to a predefined voltage level.

In this case the first duration is not fixed or predefined, but is dynamically determined.

In an example, before or at the start of the first time interval a predefined voltage V1 is applied to the first capacitor, at the start of the first time interval a biasing current is allowed or forced to flow through the capacitor and the resistive sensor structure, and the end of the first time interval is defined as the moment at which the voltage over the first capacitor reaches a predefined voltage level V2. Such embodiment is referred to herein as "fixed delta-V mode", an example of which is shown in FIG. 8.

In an embodiment, step d) comprises integrating or averaging the momentary readout signal using a continuous-time integrating or a continuous-time averaging circuit.

In an embodiment, step e) comprises determining the sensor readout signal by calculating according to one of the following formulae: Vout=A×Vi/Qbias; or Vout=Vout0 (1+B×(Qbias−Qbiasref)), or an equivalent formula, wherein Vout is the sensor readout signal compensated for bias current drift, A is a predefined scale factor, Vi is the signal provided by the continuous-time integrating or continuous-time averaging circuit as a result of step d), Qbias is representative for the total amount of charge that has flowed through the resistive sensor structure during the second time interval, Qbiasref is representative for a predefined amount of charge that nominally flows through the resistive sensor structure during the second time interval, Vout0 is the sensor readout signal not compensated for bias drift obtained from Vi under the assumption that said predefined amount of charge has flowed through the resistive sensor structure during the second time interval, and B is a predefined compensation factor.

It is noted that Qbias can correspond to the charge stored on a single capacitor which is discharged through the sensor structure only once (N=1), or can correspond to the charge stored on a single capacitor which is discharged a predefined number (N>1) of times while the output signals are cumulatively integrated, or can correspond to the total charge stored on multiple capacitors which are each discharged only once, or can correspond to the total charge stored on multiple capacitors at least some of which are discharged more than once, depending on the specific implementation. In this way the SNR can be improved.

It is noted that Qbias is dependent on a change in state (e.g. ΔQ, ΔV) of at least the first capacitor.

"Qbias being representative for the total amount of charge" means that Qbias is equal to this amount of charge, or that Qbias is proportional to this amount of charge, the proportionality factor involved being substantially independent of the amount of charge. A known factor which is substantial independent of the amount of charge is the capacitance of any integrated capacitors, e.g. the capacitance Cval of the first capacitor C1.

The former formula is a non-linearized compensation formula, and remains valid when Qbias deviates substantially from Qbiasref, e.g. Qbias being twice, or even 10 times as large as Qbiasref.

The latter formula is a linearized compensation formula, valid when Qbias has relatively small deviates from Qbiasref, e.g. less than 10%, which is mostly the case when Qbias is only affected by small drift phenomena.

Any of the above predetermined factors, e.g. the scale factor A and/or the compensation factor B, may be a known function of temperature, which may also be determined by means of calibration.

In an embodiment, the quantity Qbias representative for the total amount of charge that has flowed through the resistive sensor structure is calculated by one of the following formulae:

$Q_{bias}=(Vc1-Vc2)*Cval*(T2/T1)$, or $Q_{bias}=(Vc1-Vc2)(T2/T1)$, or $Q_{bias}=(Vc1-Vc2)$, wherein Vc1 is the voltage over the first capacitor at the start of the first time period, Vc2 is the voltage over the first capacitor at the end of the first time period, and Cval is a capacitance of the first capacitor, and T2 is the cumulated duration of one or more second time intervals during which the momentary readout signal is cumulatively integrated.

In mathematical form, T2/T1=N, where N is preferably an integer value, such that T2 can be composed of a number of iterations.

In an embodiment, the duration of T2 is equal to the duration of T1, thus N=1.

In an embodiment, the duration of T2 is N times the duration of T1, N being an integer value larger than 1, or larger than 2 or larger than 3, or larger than 5, or larger than 10.

The voltage Vc1 at the start can be set (e.g. imposed) or can be measured. The voltage Vc2 can be measured, for example in case the time period is fixed, or can for example be a predetermined threshold value, for example in case the time period is not fixed.

It is noted that Cval is the electrical capacitance of the capacitor, which is a constant value that is independent of stress and temperature. Of course, if the device comprises multiple capacitors connected in parallel, the total charge is the sum of the charges that has flowed through each of the capacitors. In most cases, the capacitances (e.g. Cval) can be treated as constants that can be absorbed in other scale and/or compensation factors, e.g. the factors A and B as described above.

If the capacitor is for example discharged twice from a voltage Vc1 to a voltage Vc2, without resetting the integrator in between, then the "total charge" that has flowed through the capacitor is $2*(Vc1-Vc2)*Cval$, or in general, for N iterations, the total charge is $N*Cval*(Vc1-Vc2)$.

In an embodiment N is equal to 1.

In an embodiment, N is larger than 1, for example N=2, or N=3 or N is at least five, or N is at least equal to 10.

With "cumulatively integrated" is meant: integrating over one or more time slots, optionally spaced in time, but without resetting the integrating circuit.

In an embodiment, the biasing circuit furthermore comprises a second capacitor, and the biasing circuit is furthermore configured for allowing or forcing the biasing current to selectively or alternatingly flow either through said first capacitor and through the resistive structure or through said second capacitor and through the resistive structure.

In an embodiment, the Qbias representative for the total amount of charge that has flowed through the resistive sensor structure is calculated by one of the following or equivalent formulae:

$Q_{bias}=(Vc1-Vc2)*Cval1*K+(Vc3-Vc4)*Cval2*M$, or $Q_{bias}=(Vc1-Vc2)*K+(Vc3-Vc4)*Cval2/Cval1*M$, or $Q_{bias}=(Vc1-Vc2)*Cval1/Cval2*K+(Vc3-Vc4)*M$, or $Q_{bias}=(Vc1-Vc2)*K+(Vc3-Vc4)*M$, or $Q_{bias}=(Vc1-Vc2)+(Vc3-Vc4)*M/K$, or $Q_{bias}=(Vc1-Vc2)*K/M+(Vc3-Vc4)$, or $Q_{bias}=(Vc1-Vc2)+(Vc3-Vc4)$, wherein Vc1 is the voltage over the first capacitor at the start of one or more second time period, Vc2 is the voltage over the first capacitor at the end of said one or more second time period, Cval1 is a capacitance of the first capacitor, K is the number of times the momentary readout signal is cumulatively integrated when a corresponding biasing current is flowing through the first capacitor, and wherein Vc3 is the voltage over the second capacitor at the start of one or more second time period, Vc4 is the voltage over the second capacitor at the end of said one or more second time period, Cval2 is a capacitance of the second capacitor, M is the number of times the momentary readout signal is cumulatively integrated when a corresponding biasing current is flowing through the second capacitor.

It is an advantage of using two (or more) capacitors that one capacitor can be initialized (e.g. precharged or discharged) while the other capacitor is conducting the biasing current that flows through the resistive sensor structure, and vice versa. In this way a substantially continuous current can flow through the resistive sensor structure, and the integration can continue so as to provide a larger sensor readout signal. Furthermore, the amount Qbias representative for the charge that flows through the resistive sensor can be monitored continuously.

In a second aspect, the present invention provides a device for biasing a resistive sensor structure and for obtaining a sensor readout signal or sensor readout value from said sensor structure, the device comprising: means for setting or for measuring or for detecting a first state of a first capacitor, the first state corresponding to a first amount of charge; a biasing circuit comprising said first capacitor connected or connectable to at least one of the excitation nodes of the resistive sensor structure for allowing or forcing a biasing current to flow through said first capacitor and through said resistive sensor structure during a first time interval; a continuous time integrator or averager having an input connected or connectable to the readout nodes of the resistive sensor structure, and being adapted for providing an output signal representative of a continuous-time integral or average of the momentary differential voltage signal over the readout nodes; means for setting or for measuring or for detecting a second state of a first capacitor, the second state corresponding to a second amount of charge at the end of the first time interval; a control unit adapted for controlling the biasing means such that said biasing current flows through said first capacitor and through said resistive sensor structure during a first time interval, the control unit being further adapted for controlling the continuous time integrator integrating or averaging circuit such that said differential voltage signal is cumulatively integrated or averaged during a second time interval; the control means being further adapted for determining the sensor readout signal or the sensor readout value based on the integrated or averaged signal and on a change in state of at least the first capacitor wherein the change in state is related to the difference in charge between the first state and the second state of at least the first capacitor C1.

The device may be an integrated semiconductor device, e.g. a CMOS device, which may include further functionality, such as for example an ADC and/or a signal processor.

In particular embodiments, the means for setting a state of a capacitor comprises one or more switches for connecting said capacitor to a voltage source.

In particular embodiments, the means for measuring a state of a capacitor comprises an analog-to-digital conversion circuit.

In particular embodiments, the means for detecting a state of a capacitor comprises a comparator.

In particular embodiments, the device is an integrated semiconductor pressure sensor.

In particular embodiments, the device is an integrated semiconductor angular position sensor.

In an embodiment, the device further comprises a timer unit for determining or setting or capturing a duration of the first time interval and for determining or setting or capturing a duration of the second time interval.

In an embodiment, the device further comprises a comparator unit for determining the moment at which the second state of the first capacitor reaches a predefined value.

In an embodiment, the device further comprises switching means for selectively connecting the first capacitor to nodes for precharging the first capacitor, and for selectively connecting the first capacitor to at least one excitation node of the resistive structure for allowing or forcing the biasing current to flow through the first capacitor and through the resistive sensor structure.

In an embodiment, the device furthermore comprises an operational amplifier having a first input connected or connectable to a reference voltage, and having a second input operatively connected or connectable to the resistive sensor structure, and the device is configurable in a mode of operation wherein the first capacitor is connected to the operational amplifier in a manner such that a current flowing through the capacitor also flows through the resistive sensor structure.

In an embodiment, the second input of the op-amp is operatively connected to one of the excitation nodes of the resistive sensor structure.

In an embodiment, the second input of the op-amp is operatively connected to one or both of the readout nodes of the resistive sensor structure.

In an embodiment, the device further comprises a common mode voltage generator circuit having two inputs connected to the two readout nodes or to the two excitation nodes of the resistive sensor structure, and being adapted for generating a common-mode voltage, and an input of the operational amplifier is connected to an output of the common mode voltage generator circuit.

In an embodiment, the device further comprises a second capacitor connected or connectable to at least one of the excitation nodes of the resistive sensor structure, and the control means is further adapted for setting or for measuring a third state of the second capacitor, and for optionally measuring a fourth state of the second capacitor.

In an embodiment, the continuous time integrator or averager is a circuit selected from the group consisting of: a resettable continuous-time integrator circuit, a continuous-time integrator or low-pass filter followed by a circuit adapted for evaluating a change of the low-pass filtered output at an end of a second time interval relative to the low-pass filtered output at a beginning of said time interval, a single-slope integrating ADC, a multi-slope integrating ADC, a continuous-time sigma-delta modulator, an integration-based low-noise amplifier, an integration based voltage-to-time conversion circuit, a VCO-based conversion circuit.

An "integration based voltage-to-time conversion circuit" may be based on pulse-width modulation, pulse-frequency modulation, or pulse-position modulation.

A "VCO based conversion circuit" exploits the known fact that the output of a voltage-controlled oscillator (VCO) has a phase corresponding to an integral of its input voltage.

In an embodiment, the device further comprises said resistive sensor structure.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 3(a) shows a high-level block diagram of the device or circuit or system comprising a biasing circuit and a readout circuit connected to a resistive sensor structure.

FIG. 3(b) shows an exemplary waveform of a voltage over a first capacitor.

FIG. 3(c) shows an exemplary waveform at the output of the readout circuit, more particularly for a readout circuit based on a resettable integrator.

FIG. 5(a) shows a hardware block diagram.

FIG. 5(b) shows an exemplary waveform of the op-amp output as a function of time.

FIG. 7(a) shows a hardware block diagram.

FIG. 7(b) shows an exemplary waveform of the op-amp output as a function of time.

FIG. 8(a) shows a hardware block diagram.

FIG. 8(b) shows an exemplary waveform of the op-amp output as a function of time.

DETAILED DESCRIPTION OF ILLUSTRATIVE EMBODIMENTS

Figure 1A:
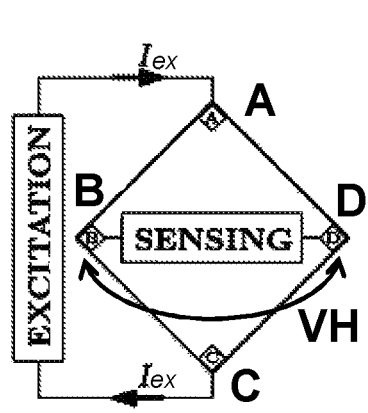
FIG. 1(a) to FIG. 1(c) show classical ways of biasing a Hall element and reading out the Hall element using a constant current source or a constant voltage source.
Figure 1B:
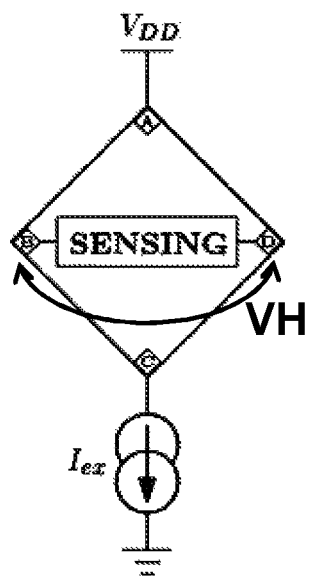
Figure 1C:
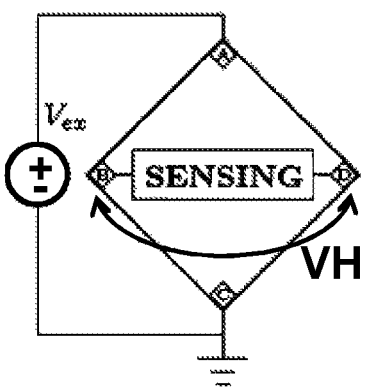
Figure 1D:
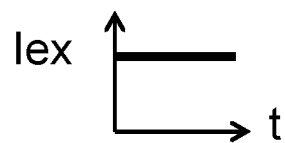
FIG. 1(d) to FIG. 1(f) show examples of biasing waveforms.
Figure 1E:
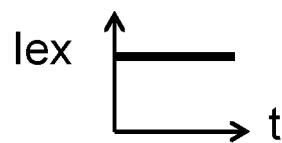
Figure 1F:
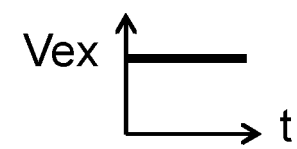
Figure 2:
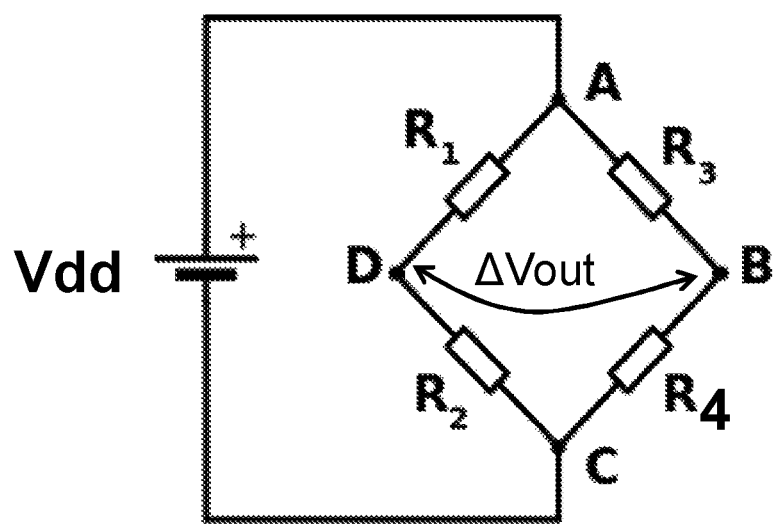
FIG. 2 shows a classical way of biasing and reading out a Wheatstone bridge.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

With "current source" is meant an electronic circuit that delivers or absorbs an electric current which is independent of the voltage across it. An "independent current source" (or sink) delivers a predetermined current. A "dependent current source" delivers a current which is a function of some other voltage or current. An "ideal current source" has an infinitely high internal resistance. In practice, a "current source" has a high output impedance. With "high-impedance" is meant having an impedance higher than 10 k$\Omega$, preferably higher than 100 k$\Omega$.

With "continuous-time integrating or averaging circuit" is meant a "continuous-time integrating circuit" or a "continuous-time averaging circuit".

In this document, the terms "continuous-time integrating or averaging circuit" and "continuous-time integrator or averager" are used as synonyms.

When reference is made to "the time interval", reference is made to "the first time interval" (during which current flows through the first capacitor), or to "the second time interval" (during which current flows through the passive resistive sensor structure), or both, depending on the context. For example, in case the first and second time interval coincide in absolute time, both the first and the second time interval are meant. For example, when describing "biasing aspects", reference is made to the first time interval or both time intervals. For example, when describing "readout aspects", reference is made to the second time interval or both time intervals.

A "single measurement" typically comprises a single first time interval T1 and one or more second time intervals T2, but may also comprise no first time intervals and one or more second time intervals, for example if the duration of the first time interval T1 is already known, for example predetermined or measured in a previous measurement.

The present invention relates to methods and circuits for biasing and reading out passive resistive sensor structures, such as for example a Wheatstone bridge or a Hall element, further referred to herein as "sensor structure". The present invention is primarily concerned with biasing the sensor structure, and obtaining an analogue value from the sensor structure, and optionally also with obtaining a analogue or digital value representative of the physical signal to be measured, such as pressure exerted on the membrane upon which the Wheatstone bridge is located, or a magnetic field component. Further processing of the signal or value obtained by the readout circuit, for example by (further) amplification, and/or filtering, and/or signal processing and/or arithmetic functions (such as e.g. calculating an angular position based on a cosine signal and a signed signal is not the main focus of the present invention.

For ease of the description, the invention will be described in more detail for a Hall element as an example of a passive resistive sensor structure, but the present invention is not limited thereto, and will also work for biasing and reading out other passive resistive sensor structures.

As explained in the background section, the basic principle of using a Wheatstone bridge composed of piezoresistive elements arranged on a flexible membrane to measure a pressure value, and the use of a Hall element to measure a magnetic field component, is known in the art for many decades. It is however a challenge to find circuits and methods that provide a highly accurate sensor signal or sensor value, under various circumstances, in particular under temperature variations and/or mechanical stress and/or biasing variations.

Several solutions are proposed in the art to reduce the error caused by one or more of these influences. Some of these prior art solutions focus on the geometry and/or orientation of the elements of the sensor structure itself, others focus on particular ways of biasing (see for example EP2722682, also referred to herein as "floating plate biasing"), yet others focus on temperature and stress compensation by post-processing (see for example EP3109658).

The present invention focuses mainly on the biasing circuit and the readout circuit, but can of course be combined with other techniques to further improve the results, in particular with spinning current techniques for offset-compensation, and/or with temperature-compensation, and/or with a compensation of the piezo-Hall effect, etc.

Figure 3A:
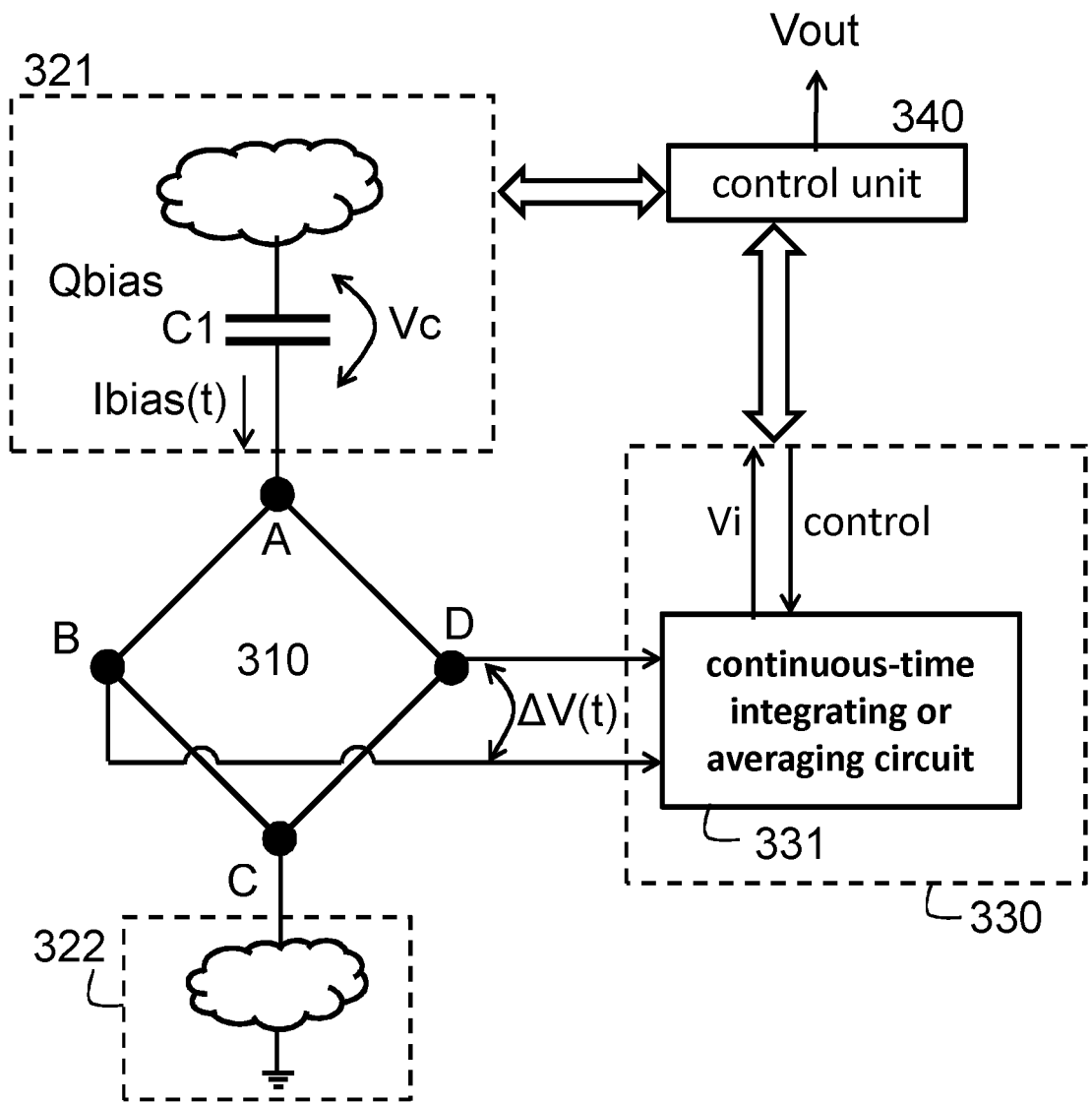
FIG. 3(a) to FIG. 3(c) illustrates an embodiment according to the present invention.
Figure 3B:
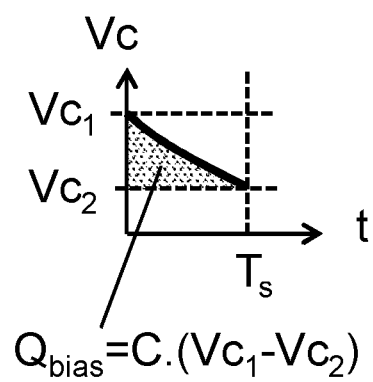
Figure 3C:
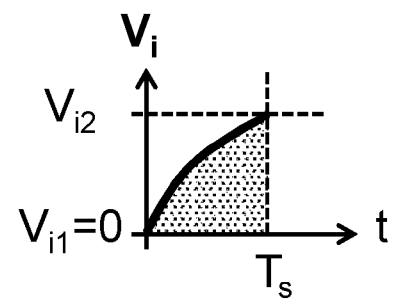

FIG. 3(a) to FIG. 3(c) illustrates (at high level) the main principles and embodiments according to the present invention.

FIG. 3(a) shows a high-level block diagram of a circuit 300 or system, e.g. a semiconductor device, comprising a passive resistive sensor structure 310 connected to a biasing circuit, which in the example of FIG. 3(a) comprises a first part 321 connected to excitation node A, and a second part 322 connected to excitation node C. The first part 321 and the second part 322 may be interconnected and/or may be interdependent e.g. by using a so called "dependent current source" for generating a current depending on a voltage in the first part, for example in accordance with the principles explained in EP2722682, but the present invention is not limited thereto. The first part 321 of the biasing circuit is connected to excitation node A of the passive resistive sensor structure 310 and is adapted for providing (sourcing) a current Ibias(t) to the resistive sensor structure 310, and the second part 322 is adapted for sinking that current, or vice versa. FIG. 3(a) also shows a readout circuit 330 connected to the output nodes B, D of the sensor structure 310 for receiving a differential voltage ΔV(t).

According to an underlying principle of the present invention, the biasing circuit 321, 322 comprises at least one capacitor C1, referred to herein as "first capacitor C1", arranged such that, during a first time interval T1, a biasing current Ibias (t) flows through the resistive sensor structure 310 and at the same time (i.e. simultaneously) also flows through the first capacitor C1. Therefore the amount of charge Qbias that has flowed through the resistive sensor structure 310 during a first time interval T1 can be deduced from the change in state of said first capacitor C1.

Additionally, the differential voltage signal ΔV(t) present at the output nodes B, D and resulting from applying said biasing current Ibias(t) is integrated or averaged over a second time interval T2 "identical to" or "matched to" or "related to, according to a predefined relationship" the first time interval T1 during which Qbias is or was determined, e.g. measured.

Because the differential voltage signal ΔV(t) can vary continuously over the time interval T, the integration or averaging takes place in the continuous-time domain. "Integration over a time interval T" and "averaging over a time interval T" are closely related concepts. Both can mathematically be described in terms of the continuous-time integration of the differential voltage signal ΔV(t) over the time interval T (i.e. $\int_T \Delta V(t)dt$). Averaging typically involves some form of normalization w.r.t. duration of the time interval T ($V_{avg}=1/T\int_T V(t)dt$). But also circuits performing an integration over a time interval T often have an implicit time normalization by means of an integrator time constant, e.g. an RC time constant ($V_1=1/RC\int_T \Delta V(t)dt$). In some cases, e.g. when the length of the integration interval T is equal to the integrator time constant (e.g. RC), the terms "integrator" and "averager" or "integrating" and "averaging" can be used interchangeably.

Various circuits capable of generating an "averaged or integrated signal over a time interval T" are known in the art. In preferred embodiments, the readout circuit of the present invention comprises a continuous-time integrator, but that is not absolutely required, and other circuits adapted for determining an average value over a time interval, can also be used. Examples of such "integrating or averaging circuits" comprise:
 a resettable continuous-time integrator,
 a continuous-time integrator or low-pass filter followed by a circuit evaluating the change of the filter output at the end of the time interval T relative to the filter output at the beginning of the time interval T,
 a Single-slope or multi-slope integrating ADC,
 a Continuous-time Sigma-Delta modulator,
 an integration-based low-noise amplifier (e.g. any of the circuits described in EP17150596),
 an Integration-based voltage-to-time conversion circuit, such as a pulse-width modulator,
 a VCO-based conversion circuit,
but the present invention is not limited to these examples, and other circuits capable of integrating or averaging an analog signal ΔV(t) over a time interval T may also be used.

The circuit 300 may further comprise a control circuit or control unit 340 adapted (inter alia) for resetting or precharging the capacitor C1, and for resetting the integrator 331, and for starting and stopping the current flow through the capacitor C1 during a time interval T1 and for starting and stopping the current flow through the sensor structure 310 during a time interval T2, and for starting and stopping the continuous-time averager or integrator 331.

The inventors have surprisingly found that, for a given sensor structure 310 and for a given first capacitor C1, that the output Vi of the continuous-time integrating or averaging circuit 331 is proportional to the total charge Qbias that has flowed through the first capacitor C1, and that has flowed through the sensor structure 310 simultaneously or later or earlier, even if the current Ibias(t) or the voltage at the excitation nodes A, C deviates from its expected value (e.g. from a predefined constant value), and/or drifts over the lifetime of the sensor. Thus, in contrast to prior art solutions, where huge efforts are done in trying to keep the drift of the current Ibias that flows through the sensor structure 310 and/or the drift of the voltages VA, VC applied to the excitation nodes A, C as low as possible, such measures are not required for the solutions provided by the present invention. In other words, neither the voltages at the excitation nodes A, C and neither the current Ibias(t) flowing through the sensor structure 310 needs to be constant during the time interval T, and its exact value need not be known or set, and may even vary with mechanical stress and/or with temperature or due to other influences.

It is to be noted that, where in the prior art, the nominal value of the bias source is said to be "known", the actual value often deviates from this nominal value through various (unwanted) mechanisms. This can be due to ageing and/or environmental influences, such as e.g. (uncompensated) temperature dependencies, parasitic stress (e.g. from the package), etc.

An underlying principle of the present invention is that, in a first time interval T1 during which the bias current Ibias(t) flows through the resistive sensor structure 310, the bias current Ibias(t) also simultaneously flows through the capacitor C1 (or through the at least one capacitor C1, as will be explained further), and that in a second time interval T2 during which the bias current Ibias(t) flows through the resistive sensor structure 310 the resulting differential voltage signal ΔV(t) over the output nodes B, D is integrated or averaged, with the second time interval T2 having the same duration, or being an integer multiple, or at least having a predefined relationship to the duration of the first time duration T1, so that the current that has flowed (or will flow) through the sensor structure 310 during the second time interval T2, can be determined from the difference in charge of the capacitor C1 (or the at least one capacitor C1) during the first time interval T1.

A major advantage of this solution is that the total charge Qbias can easily and accurately be determined, for example as the difference between a first amount of charge Q1 stored on the capacitor C1 at the start of the interval T1, and a second amount of charge Q2 stored on the capacitor C1 at the end of the interval T1.

The skilled person having the benefit of the present disclosure will of course understand that the same or similar effect can be achieved when using more than one capacitor, for example at least two capacitors C1 and C2, in which case of course the total amount of charge Qbias that has flowed through the resistive sensor structure 310 can be determined or calculated as the sum of the differences of charge on each of these capacitors.

As is well known in the art of electronics, the charge Q stored on a capacitor C can easily be determined by the following or an equivalent formula:

$$Q = C * V \quad [1]$$

where C is the capacitance of the capacitor, and V is the voltage over the capacitor, and Q is the amount of charge stored on the capacitor. And it is also well known that the amount of change added to or removed from the capacitor, thus the change of the amount of charge ΔQ, can be determined by the following or an equivalent formula:

$$\Delta Q = C * \Delta V \quad [2]$$

where C is the capacitance of the capacitor, ΔQ is the change of charge, and ΔV is the change of voltage over the capacitor, either of which is referred to herein as "change of state" of the first capacitor C1.

Using these or similar formulas, it is easy to determine the amount of charge stored on a capacitor, e.g. by setting or measuring a voltage over the capacitor C1. Likewise, it is easy to determine the amount of charge ΔQ that has passed through the capacitor C1, for example by measuring a voltage V1 before, and a voltage V2 after the current has flowed through the capacitor.

The skilled person having the benefit of the present disclosure will also understand that the same or similar effect can be achieved when a measure of the total charge Qbias is obtained by observing a change in voltage of one or more nodes in the first part 321 of the biasing circuit when this change accurately reflects a change in state of the capacitor C1. Sufficient accuracy can be obtained in a number of well-known situation, e.g. when only ratios of matched components are involved and/or when interrelations are enforced by application of feedback principles (as will be explained further, e.g. in FIG. 8, where the feedback provides a link between the voltage over the capacitance and the voltage Vamp at the output of the op-amp 823).

It can be understood from the above that the best achievable accuracy using this method is limited by how accurately and how stable the capacitance value C of the first capacitor C1 can be, and as is well known in the field of semiconductor devices, the capacitance formed for example by two parallel conductive plates having specific dimensions (e.g. length and width) and being located at a predefined distance "d" from each other, e.g. separated by an isolation layer having a predefined thickness, can be produced very accurately (e.g. with tolerances in the order of less than 1000 ppm), but advantageously, such capacity is highly insensitive to mechanical stress and/or temperature variations, in contrast for example to the electrical resistance of a Hall element, which is highly dependent on mechanical stress and on temperature variations.

Having explained the underlying concepts of the present invention, the invention will now be further elucidated by way of several examples, illustrating particular embodiments of the present invention. However, first some common features will be described in more detail.

Referring back to FIG. 3(*a*), it can be seen that the first capacitor C1 is directly connected to excitation node A, but that is not required for the present invention to work, and the first capacitor C1 may for example also be connectable to excitation node A via one or more switches (see for example switch S707 in FIG. 7(*a*) and switch S805 in FIG. 8), or via a transistor or circuit that acts as a current follower.

The time interval T may be a predefined time interval having a predefined fixed duration. In such embodiments, the control unit 340 may further comprise a timer unit or a counter or the like for determining the duration of the time period T.

But the time interval T can also be determined dynamically, for example as the time needed for the voltage V over the first capacitor C1 to increase or decrease from a first predefined voltage level V1 (at the start of the time interval T) to a second predefined voltage level V2 (at the end of the time interval T). In such embodiments, the control circuit 340 may comprise one or more comparators adapted for detecting when the voltage over the first capacitor C1 reaches said predefined voltage level V2, at which moment the current flow and the integration or averaging may be stopped.

In case one or more switches are used to start and stop the current flow, the control unit 340 may be adapted for controlling these one or more switches for pre-charging the capacitor, and/or for resetting, starting and stopping the timer or counter, and/or for resetting, starting and stopping the continuous time integrator or averager 331, and/or for measuring a voltage V1 and/or V2 over the capacitor C1, for example by means of an analog-to-digital convertor (ADC).

FIG. 3(b) shows an exemplary waveform of the voltage over a first capacitor C1. In this example, the capacitor C1 was pre-charged to a first voltage VC1 at the start of the time interval, and is discharged to a second voltage VC2 at the end of time interval T. Irrespective of whether the voltage waveform is linear or exponential or quadratic or any other shape, the charge Qbias that has flowed through the capacitor C1 and through the resistive sensor structure 310 can be calculated using the following formula or an equivalent formula:

$$Q\text{bias}=C^*(VC1-VC2) \quad [3]$$

FIG. 3(c) shows an exemplary voltage waveform at the output of a continuous time integrator comprised within the integrating or averager readout circuit 331. The output of the integrating or averaging readout circuit 331 is determined only by the first value Vi1 at the start of time interval T and by the second value Vi2 at the end of time interval T, not by the values at intermediate points. The first value Vi1 may be zero, e.g. when the integrator is reset at the start of the time interval T, but that is not absolutely required. The output Vi of the integrating or averaging readout circuit 331 is in many cases determined by the difference Vi2-Vi1, e.g. Vi=Vi2-Vi1.

The sensor signal can be calculated by the following or equivalent formulas:

$$\text{sensor signal}=Vi/Q\text{bias} \quad [4]$$

$$\text{sensor signal}=Vi/[C\cdot(Vc1-Vc2)] \quad [5]$$

with Vi the integrated or averaged readout signal obtained by integrating or averaging over a definite interval T.

In contrast to many prior art methods, where the differential voltage over the readout nodes B,D of the sensor structure represents the sensor signal to be measured, that is not the case for the present invention.

The sensor signal typically needs to be multiplied by a sensitivity factor SF, for instance in order to obtain a value for the physical signal to be measured (e.g. pressure or magnetic field Bz).

$$\text{signal value}=SF^*\text{sensor signal} \quad [6]$$

The sensitivity factor SF can be determined for example during a calibration test, and can be stored in a non-volatile memory (e.g. EEPROM or FLASH).

Instead of storing a separate value for the capacity C and for the sensitivity factor SF, it is also possible to store a single value "D", corresponding to SF/C. The actual signal to be measured (e.g. pressure value or e.g. magnetic field component value Bz) can then be calculated by the following or an equivalent formula:

$$\text{signal value}=D^*Vi/(Vc1-Vc2) \quad [7],$$

where D is a predefined constant, Vi is the output of the integrator or averager circuit 331 performing an integration or averaging over a time interval T2, and (Vc1-Vc2) is the change of voltage of the first capacitor C1 over a time interval T1. As can be seen, the absolute duration of the time interval T1 and/or T2 does not occur in the formula.

What is described above is a method for doing "one measurement", but of course the measurement can be repeated many times per second, resulting in one sensor value for each time interval T. In case the biasing circuit only comprises a single capacitor C1, in practice some additional time may be required for pre-charging the capacitor C1, and/or for measuring the state of the capacitor at the end of the time interval.

In another mode, it is also possible to discharge the capacitor C1 multiple times, for example 2 or 5 or 10 times, but without resetting the integrator 321 in between, resulting in a higher output value.

Although not explicitly shown in FIG. 3(a), the circuit 300 may further comprise an analog to digital converter (ADC) for digitising the output Vi of the integrating circuit 331, and may further comprise a digital processor (e.g. a microcontroller or a DSP) for performing mathematical calculations.

As described above, it is important for the present invention that the momentary differential voltage signal $\Delta V(t)$ over the readout nodes B, D of the sensor structure 310 is integrated or averaged over a time interval T. The duration of the time interval T can be predetermined (e.g. set beforehand), or can be dynamically determined (e.g. ending when the voltage over the first capacitor C1 reaches or passes a predefined threshold level V2). It is explicitly pointed out that, in contrast to prior art embodiments, where the biasing voltage or biasing current is kept as constant as possible, such that the differential output signal (VB-VD) is indicative, e.g. proportional to the physical signal to be measured (e.g. pressure), that is not required for the present invention to work.

In contrast, in embodiments of the present invention, the momentary differential voltage signal $\Delta V(t)$ over the readout nodes B, D will not only vary depending on the actual physical signal to be measured (e.g. pressure "p" or magnetic field strength "Bz"), but may also vary due to variations of the biasing voltage(s) of the excitation nodes A, C.

Any readout circuit capable of integrating or averaging the signal $\Delta V(t)$ in continuous time can be used. In order to achieve high-accuracy, a "low-noise" continuous-time integrator is preferred. In preferred embodiments, a low-noise continuous-time integrator of the type having a transconductance G and a feedback path are used. Explicit reference is made to each of the circuits described in GB patent application No. 1600774.2 filed on 15 Jan. 2016 by Melexis Technologies SA, and EP application number 17150596 filed on 8 Jan. 2017, both of which are incorporated herein by reference in their entirety, including the prior art circuits mentioned therein, although other continuous-time integrator circuits can be used as well.

In case the passive resistive sensor structure 310 is a Hall-element or comprises one or more Hall elements, the readout circuit 330 preferably also comprises means for applying the "spinning-current technique" in order to reduce offset. Such sub-circuits are known in the art, and hence need not be described in more detail herein.

Figure 4:
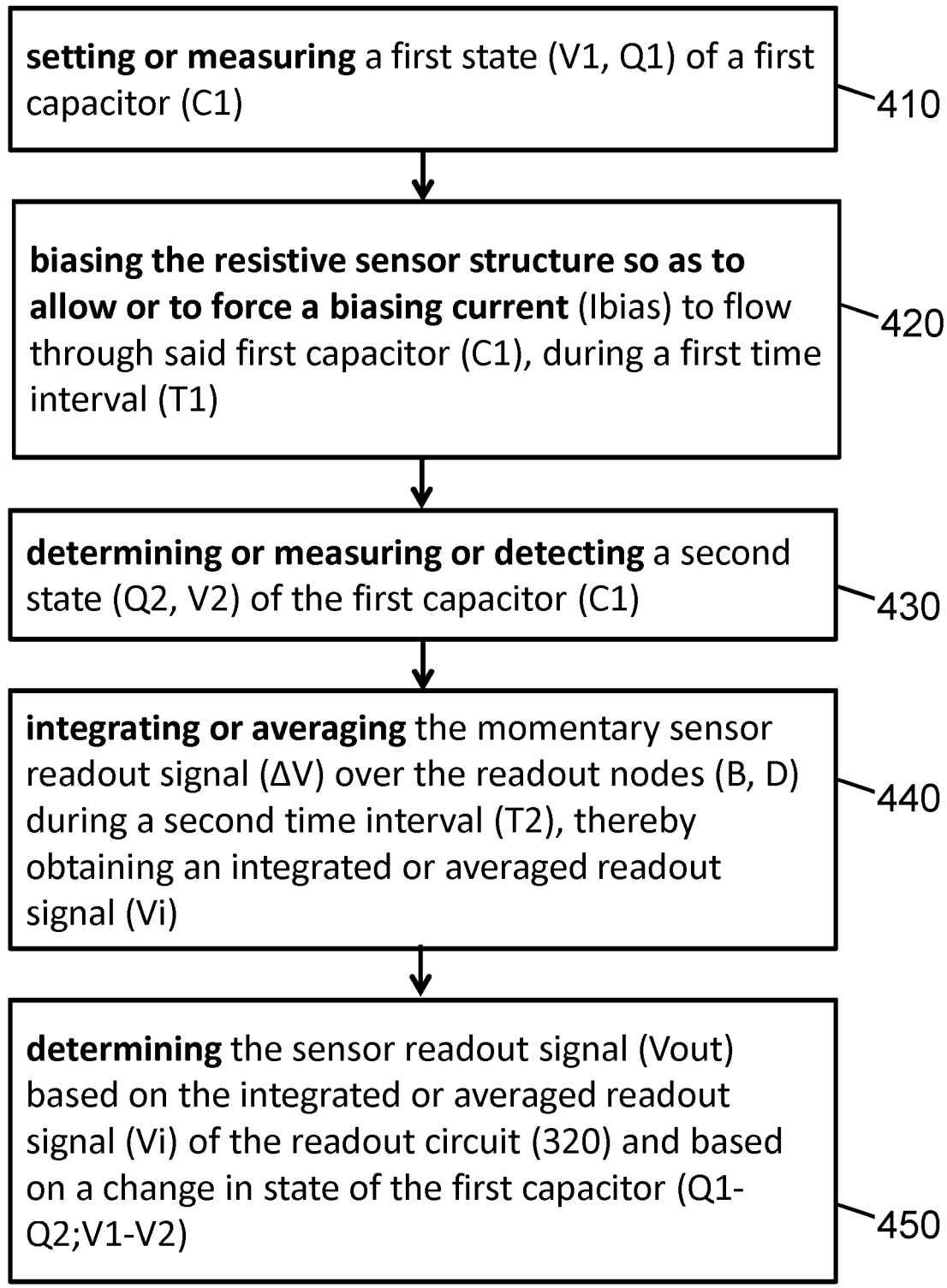
FIG. 4 shows a method according to embodiments of the present invention, which can be used for biasing and readout of the sensor structure of FIG. 3(a).

FIG. 4 shows a method according to embodiments of the present invention, which method can be used to bias and readout the circuit of FIG. 3(a). The method comprises the following steps:

setting or measuring or detecting 410 a first state of the first capacitor C1 corresponding to a first amount of charge Q1 to be stored, or already stored on the capacitor. The first state is related to the first amount of charge Q1. It is for example a first amount of charge Q1 or a first voltage V1 over the capacitor C1 or in general a measure of the first amount of charge Q1;

biasing 420 the resistive sensor structure so as to allow or to force a biasing current Ibias to flow through said first capacitor C1, during a first time interval T1. The duration of this first time interval T1 may be predefined, or may be dynamically determined;

determining or measuring or detecting 430 a second state of the first capacitor C1 corresponding to a second amount of charge Q2 stored (or left) on the capacitor C1 at the end of the first time interval; The second state is related to the second amount of charge Q2. It is for example a second amount of charge Q2 or a second voltage V2 over the capacitor C1, or in general a measure of the second amount of charge Q2;

integrating or averaging 440 the momentary sensor readout signal ΔV over the readout nodes B, D during a second time interval T2, thereby obtaining an integrated readout signal Vi;

determining 450 the sensor readout signal Vout based on the integrated or averaged readout signal Vi of the readout circuit 320 and based on a change in state of the first capacitor (Q1−Q2; V1−V2). The change in state of the first capacitor is related to the difference in charge between the first state and the second state of the first capacitor C1. It may for example be obtained by determining or calculating ΔQ=(Q1−Q2), or ΔV=(Vc1−Vc2). This step may involve using one or more of the formulas [1] to [7] described above. In general it is a measure for the difference between the first amount of charge and the second amount of charge on at least the first capacitor C1.

Figure 5A:
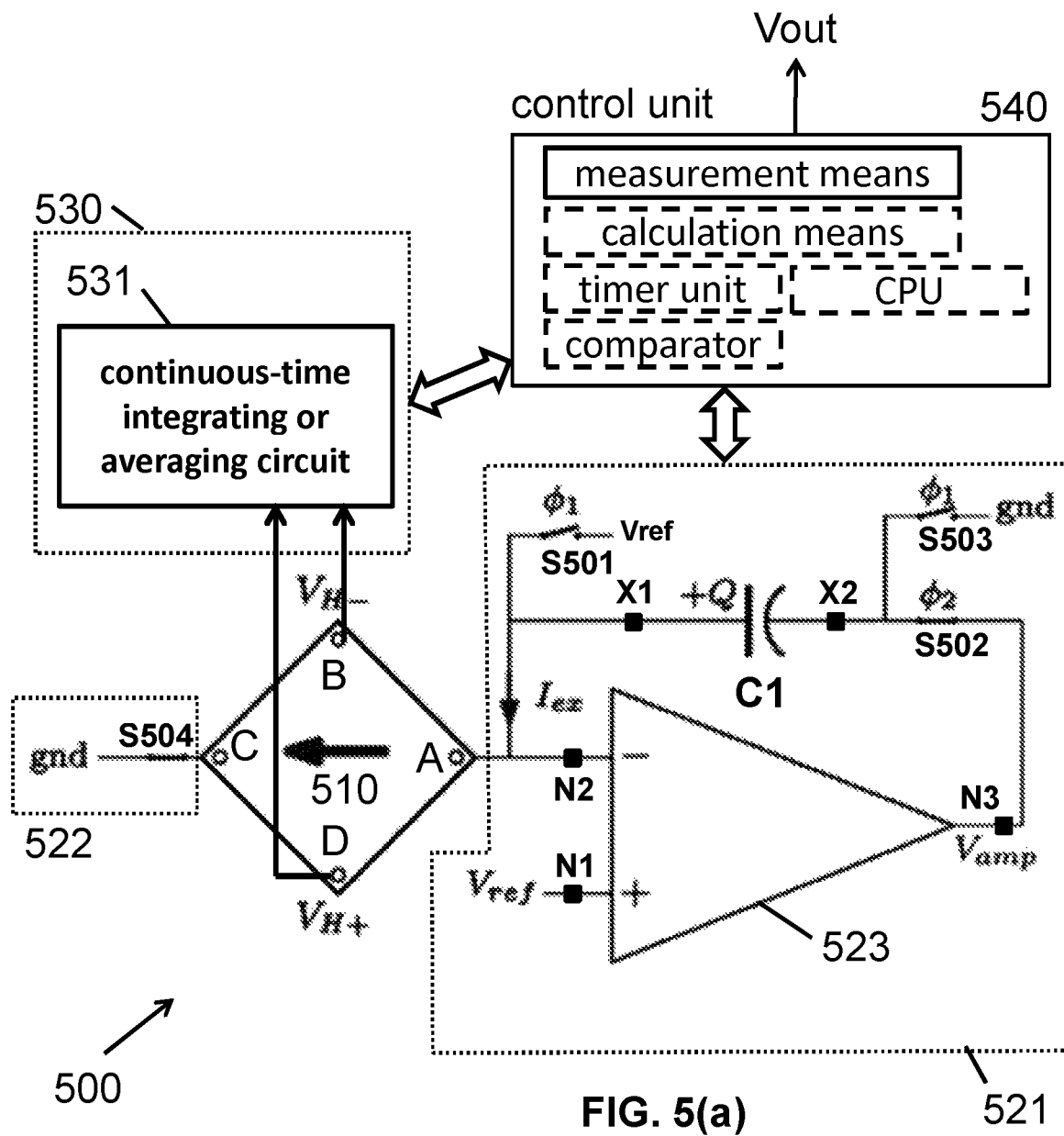
FIG. 5(a) to FIG. 5(b) shows a block diagram of a first embodiment according to the present invention, wherein the biasing circuit comprises one capacitor, for example only one capacitor.

FIG. 5(a) shows a hardware block diagram of a first embodiment 500 according to the present invention, showing more details of the first part of the biasing circuit 521.

The circuit 500 shown in FIG. 5(a) comprises: a passive resistive sensor structure 510, (e.g. a Hall element), and a readout circuit 530, and a biasing circuit 521, 522, and a control circuit 540.

The readout circuit 530 was already described above, when discussing FIG. 3(a), where it was explicitly mentioned (inter alia) that the readout circuit 530 may comprise any of the circuits described in EP17150596, but other suitable circuits may also be used.

The biasing circuit of FIG. 5(a) is composed of a first part 521 connected to node A of the sensor structure 510, and a second part 522 connected to node C of the sensor structure. In this example, the second part 522 consists of a single switch S504 having one end (right side of FIG. 5(a)) directly connected to node "C", and another end (left side of FIG. 5(a)) directly connected to ground, but the present invention is not limited thereto, and other sub circuits may also be used for the second part 522, for example (but not shown) a switch in series with a "independent current source", or an active circuit comprising for example a "dependent current source".

As can be seen, the first part 521 of the biasing circuit of FIG. 5(a) comprises one capacitor C1 operatively connected or connectable to an operational amplifier 523, and further comprises three switches, namely S501 for selectively connecting a first terminal X1 of the capacitor C1 to a first reference voltage (for example Vref or Vdd), and a switch S503 for selectively connecting a second terminal X2 of the capacitor C1 to a second reference voltage (for example Gnd), and a switch S502 for selectively connecting the second terminal of the capacitor C1 to an output node N3 of an op-amp 523. The biasing circuit is adapted for allowing a biasing current Ibias to flow through the first capacitor C1 and through the resistive sensor structure 510 (e.g. from excitation node A to excitation node C), by making use of an operational amplifier 523. As can be seen, in the example of FIG. 5(a), a predefined reference voltage Vref is applied to the non-inverting input node N1 of the op-amp. This reference voltage Vref may be close to Vdd, e.g. more than 90% of Vdd, but that is not absolutely required, and another voltage can also be used.

The biasing circuit 521, 522 of FIG. 5(a) works as follows:

In a first phase φ1 the switches S501 and S503 are closed, and switch S502 is opened. This will set the first terminal X1 of C1 to Vref, and set terminal X2 to ground Gnd, which (after settling) results in the capacitor C1 being put into a definite state determined by the voltage Vref. During the first phase φ1, switch S504 may be closed (or kept closed when it had already been closed), in which case a bias current Ibias(t) flows through the resistive sensor structure 510, the bias current being supplied by Vref which is connected by the currently closed switch S501 to excitation node A of the resistive sensor structure 510. When the current Ibias(t) is flowing through the Hall element, a differential voltage signal ΔV(t) is generated over the readout nodes B, D which is substantially proportional to a magnetic field component Bz to be measured, and may be integrated or averaged during the considered first phase φ1 by the continuous-time integrator or averager 531. A timer or counter may be used for defining the duration of the first phase φ1, which may then also define the time over which the integration or the averaging takes place (in case it is present).

In a second phase φ2 the switches S501 and S503 are opened, and the switches S502 and S504 are closed (or stay closed when this was already the case). The operational amplifier 523 will provide an output signal Vamp at its output node N3 such that the voltage at its inverting input node N2 is substantially equal to the voltage Vref applied to the non-inverting input node N1. Thus, the operational amplifier 523 will cause the voltage at node A to be substantially equal to Vref, and will cause a biasing current Ibias(t) to flow through the Hall element 510. Since no current enters the op-amp at the inverting node N2, the biasing current Ibias flows through the first capacitor C1 and through the resistive sensor structure 510, for example a horizontal Hall element. While the current Ibias(t) is flowing through the Hall element, a differential voltage signal ΔV(t) is generated over the readout nodes B, D which is substantially proportional to a magnetic field component Bz to be measured, and the differential voltage signal ΔV(t) may simultaneously be integrated by a continuous time integrator or averager 531 of the readout circuit 530. The duration of the second phase φ2 may be determined in a number of distinct ways, for instance by means of a timer or counter, or this duration may be determined through a comparator (not shown) adapted for detecting when the voltage over the capacitor C1 has decreased to a predefined voltage level V2.

At the end of the second phase φ2, the total charge which has flowed through the sensor structure 510 and through the first capacitor C1 during phase φ2 can be determined. In case of the use of a comparator adapted for detecting when the voltage over the capacitor C1 has decreased to a predefined voltage level V2, extra measurements may not be required since then the change in voltage of the capacitor C1 from Vref (at the beginning of phase φ2) to V2 (at the end of phase φ2) is known. In other cases, the state of the capacitor C1 at the end of the second phase φ2 can be measured, e.g. by means of an ADC.

It can be seen that the voltage at node C is the same (e.g. equal to gnd) during both phases φ1 and φ2, and that the voltage at node A is the same (e.g. equal to Vref) during both phases φ1 and φ2. Therefore, the biasing current Ibias(t) that flows through the resistive sensor structure during phase φ1 can be assumed to be well matched to the biasing current Ibias(t) that flows through the resistive sensor structure during phase φ2. It is therefore possible to determine an output Vi of the continuous-time integrator or averager 501 of the readout circuit 530 in either of the phases (i.e. φ1 or φ2) or both of the phases (φ1 and φ2). It is noted that in practice the matching accuracy may deteriorate when both phases have a large separation in time, which may be avoided by repeating the Qbias measurement before any slowly varying drift phenomena may affect the degree of matching.

If the change of state of the first capacitor C1 (for example ΔQ or ΔV) is known, and if an output Vi of the integrator or averager circuit 531 is obtained, e.g. measured, the sensor signal or sensor value can then be determined, for example using one or more of the formulas [1] to [7] described above. In the particular embodiment of FIG. 5(a), the total charge Qbias can also be obtained by observing the change of the amplifier output voltage Vamp, which because of the feedback provided by the first capacitor C1 is, for instance, accurately related to the change in state of this first capacitor C1. In other words, there is a link between the change of the output voltage Vamp of the op amp and the charge Qbias.

If desired, a new measurement can then be taken by repeating the steps described above. While each sensor signal or sensor value requires results from operating the circuit of FIG. 5(a) in both phases (φ1 and φ2), a determination of Qbias which requires operating in phase φ2 can often be repeated less frequently (because Qbias drifts slowly over time).

Alternatively, instead of operating the integrating or averaging circuit 531 over a time interval equal to the duration of phases φ1 and/or φ2, the integration or averaging can be made to extend over a plurality of phases φ1 and/or φ2. For example, when the integrating or averaging circuit 531 comprises a resettable integrator, instead of resetting this integrator each time the capacitor is discharged, it is also possible to reset the integrator only once every N times the capacitor C1 is discharged, N being an integer value larger than 1. In this way the differential output voltage ΔV(t) can be virtually integrated or averaged over a longer time interval equal to N*T. This is particularly suitable for measuring weak signals, but of course the maximum readout frequency is also decreased by the same factor N.

It is noted that, in the biasing scheme of FIG. 5(a), the excitation voltage applied to node A (in phase φ2) is substantially constant, and substantially equal to the reference voltage Vref. However, the absolute value of this voltage level Vref is not important for the accuracy of the measurement, which means that no special efforts need to be done to make this voltage independent of temperature and/or stress. It is an advantage for signal-to-noise reasons however, if this voltage is chosen to be relatively large, for example at least 50% of Vdd, or at least 75% of Vdd.

Also the absolute duration of the time interval T is not important for the accuracy of the measurement. The value of T may be predefined, or may be dynamically determined (using a comparator).

Figure 5B:
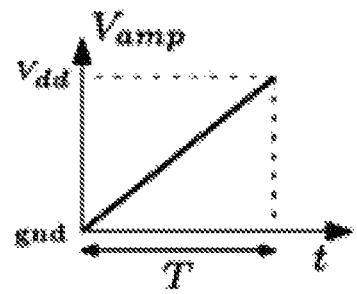

FIG. 5(b) shows a typical waveform of the voltage at the output node N3 of the op-amp 523 during time interval T. This signal is substantially linear because the current Ibias(t) flowing through the capacitor C1 and through the sensor structure 510 is substantially constant, although that is not absolutely required for the present invention to work.

Figure 6:
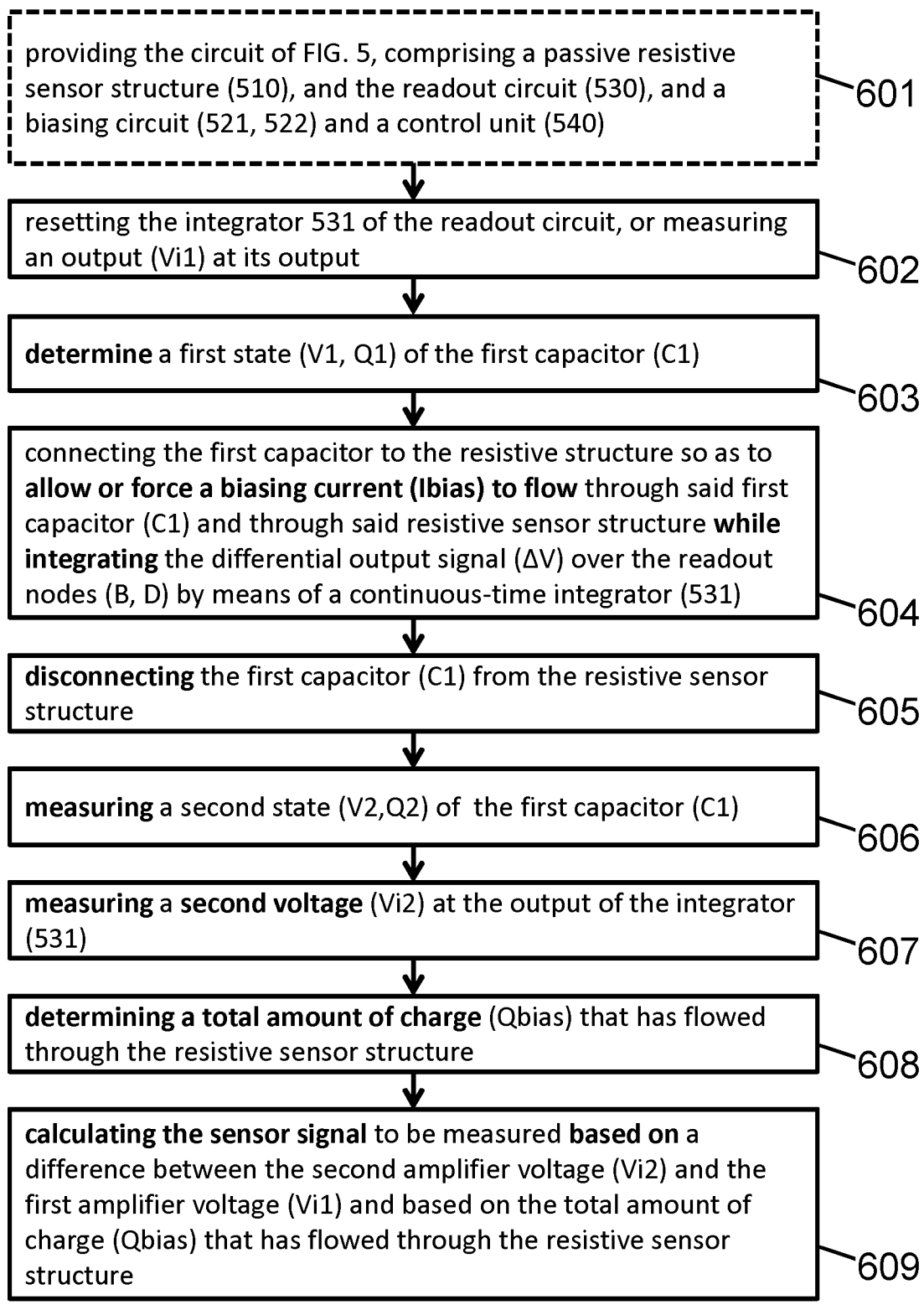
FIG. 6 shows an exemplary method according to an embodiment of the present invention, which can be used for biasing and reading out the circuit of FIG. 5(a).

FIG. 6 shows an exemplary method 600 according to an embodiment of the present invention, which can be used for biasing and reading out the circuit 500 of FIG. 5(a). In particular, this exemplary method may be used when a (resettable) continuous-time integrator is used for integrating or averaging the momentary readout signal (ΔV) at the readout nodes B, D of the resistive sensor structure.

In optional step 601, the system of FIG. 5(a) is provided, comprising said passive resistive sensor structure 510, and said readout circuit 530 and said biasing circuit 521, 522 and a control unit 540.

In step 602, the integrator 531 of the readout circuit 530 is reset or otherwise initialized, and a voltage Vi1 at its output is optionally measured.

In step 603, a first state V1, Q1 of the first capacitor C1 is determined, for example by setting or measuring a voltage V1 over the first capacitor C1, and by optionally determining a first amount of charge Q1 stored on the capacitor C1.

In step 604, the first capacitor C1 is operatively connected to the resistive structure so as to allow or force a biasing current Ibias to flow through said first capacitor C1 and through said resistive sensor structure 510 while the differential voltage signal ΔV(t) over the readout nodes B, D is being integrated by means of a continuous time integrator 531.

In step 605, the first capacitor C1 is disconnected from the resistive sensor structure 510, and in step 606 a second state of the first capacitor C1 is determined, e.g. by measuring a voltage V2 over the capacitor C1, and by optionally determining a second amount of charge Q2 stored on the capacitor C1.

In step 607, a voltage Vi2 is measured at the output of the integrator 531.

In step 608 a total amount of charge ΔQ that has flowed through the resistive sensor structure 510 and through the first capacitor C1, (over 1 or over N>1 time intervals), is determined.

In step 609, the sensor signal is determined, e.g. calculated, based on a difference of the integrator output Vi=(Vi2−Vi1) and based on the total amount of charge ΔQ=Q2−Q1 that has flowed through the resistive sensor structure 510, for example by using one or more of the formulas [1] to [7].

Figure 7A:
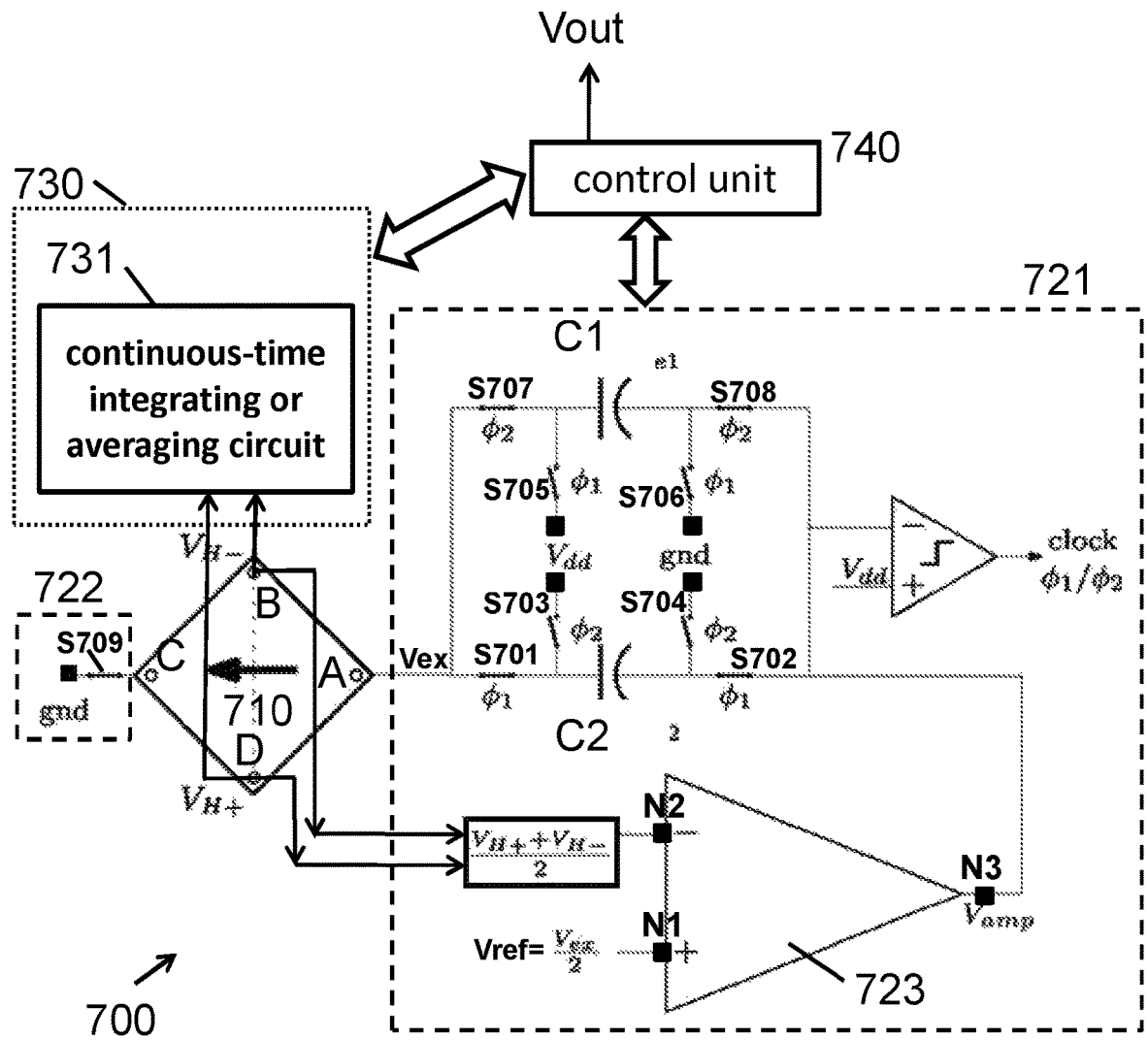
FIG. 7(a) to FIG. 7(b) shows a block diagram of a second embodiment according to the present invention, wherein the biasing circuit comprises two capacitors.

FIG. 7(a) shows a block diagram of a second specific embodiment according to the present invention. Most of what has been described above is also applicable here. The main differences between the circuit 700 of FIG. 7(a) and the circuit 500 of FIG. 5(a), are:
- the biasing circuit 721 comprises two capacitors C1, C2 instead of only one, and
- the inverting input node N2 of the operational amplifier 723 is provided with a "common mode voltage signal" equal to (VB+VD)/2, which is the average of the voltage signals VB and VD at the output nodes B, D of the Hall element. (The interested reader is referred to EP2722682 for more information).

Similar to FIG. 3(a) and FIG. 5(a), the second part 722 of the biasing circuit is shown here as a mere switch S709 directly connected to ground, but in practice it may be advantageous that the node C is not directly connected or connectable to a fixed voltage, but to a high-ohmic impedance, for example for a subcircuit 722 (not shown) comprising a "independent current source". Other implementations of the second part 722 are also possible.

The principle of operation of this biasing circuit 721 is very similar to that of FIG. 5(a), except that in the circuit 700 the capacitors are recharged to Vdd (which can be seen as a particular choice of Vref compared to FIG. 5(a) and that one capacitor (e.g. C1) can be recharged while the biasing current is flowing through the other capacitor (e.g. C2), and vice versa: C2 can be recharged while the biasing current flows through C1, in an alternating manner. This allows to determine Qbias during each of the phases φ1 and φ2 (while in the embodiment of FIG. 5 this could only be done during phase φ2). By selectively opening and closing the switches S701, S702, S703, S704, S705, S706, S707, S708, at appropriate moments in time, such that one of the capacitors C1, C2 is being pre-charged while the other of the capacitors C2, C1 is being discharged, it is possible to perform a number N (e.g. N=2 or N>2) of "discharge-actions" without stopping the biasing current Ibias and without stopping the continuous-time integration or averaging, until the complete cycle having a total duration of N*T is over, T being the time of one discharge, as explained above.

Figure 7B:
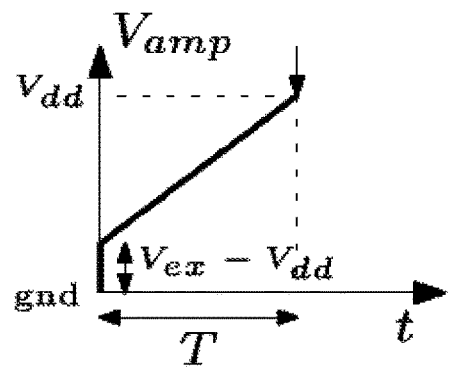

FIG. 7(b) shows a typical waveform of the voltage Vamp at the output node N3 of the op-amp 723 during one time interval T. This signal is substantially linear for the same reasons as mentioned in relation to FIG. 5(b).

Figure 8A:
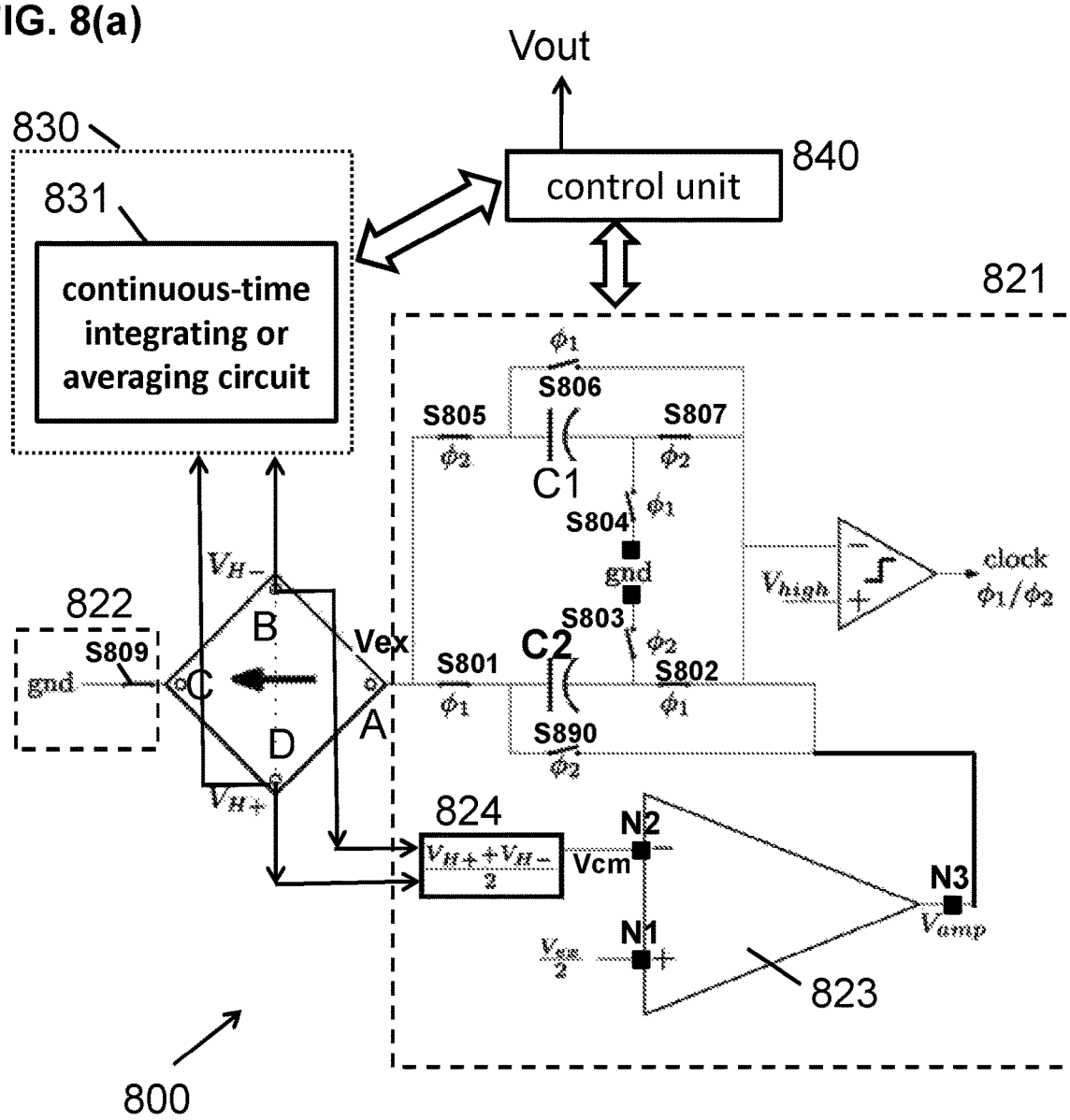
FIG. 8(a) to FIG. 8(b) shows a block diagram of a third embodiment according to the present invention, which can be seen as a variant of the second embodiment, wherein the capacitors are charged by an output of an operational amplifier rather than by a constant voltage.
Figure 8B:
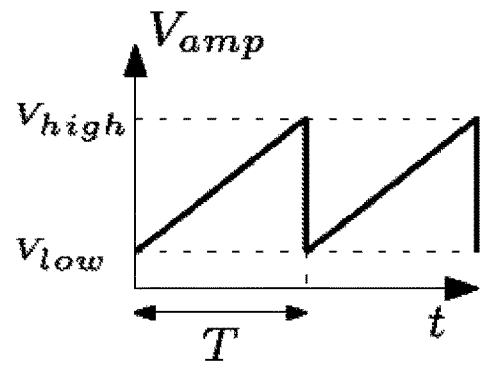

FIG. 8(a) to FIG. 8(b) shows a block diagram of a third embodiment according to the present invention, which can be seen as a variant of the second embodiment 700, also having two (or at least two) capacitors C1 and C2, but wherein the capacitors C1, C2 are charged by an output of an operational amplifier 823 rather than by a constant voltage Vdd. FIG. 8(a) shows a hardware block diagram, FIG. 8(b) shows an exemplary waveform of the voltage on the output node N3 of the op-amp 823 as a function of time.

It is an advantage of this embodiment, that the excitation voltage Vex which will be applied to node A during operation, can be higher than Vdd, for example at least 30% higher or at least 50% higher. This has a positive effect on the signal-to-noise ratio, and thus improves the accuracy even more.

A problem with passive resistive sensor structures is the inherent thermal noise "N", also called "Johnson noise". The thermal noise level is dictated by the resistivity of the sensor structure and its temperature, and is independent of the magnitude of the applied biasing. In contrast, the useful sensor signal "S" increases with the level of the applied biasing. Therefore, increasing the bias level improves the signal-to-noise "S/N" ratio.

The principle of operation of this biasing circuit 821 is very similar to that of FIG. 7(a), except that capacitors C1, C2 are recharged by the amplifier output Vamp instead of Vdd. More specifically, the applied feedback configuration is the same as for the biasing circuit 721, and therefore, during discharging of one capacitor, the amplifier output Vamp linearly increases. During this time interval, the other capacitor is connected to Vamp, resulting in the latter being linearly charged. As soon as Vamp reaches an upper voltage Vhigh, this is detected by the comparator, and the roles of the two capacitors are swapped. At the moment of swapping, the voltage over the recharged capacitor is Vhigh (the same as the voltage of Vamp at that time). Therefore, directly after the swap, the amplifier output voltage Vamp drops to Vlow=Vex−Vhigh because of the feedback configuration that arises. One advantage of the linear recharging obtained by biasing circuit 821 is that typically a more constant current will be drawn from the supply (compared to an abrupt charging of the capacitor which causes a peak in the supply current).

While the present invention has been illustrated mainly for a so called "horizontal Hall element", the present invention is not limited thereto, and can also be used for biasing and readout of a "vertical Hall element", or other passive resistive structures. The principles of the present invention can, of course, be used in conjunction with other techniques, such as spinning-current techniques.

While individual features are explained in different drawings and different embodiments of the present invention, it is contemplated that features of different embodiments can be combined, as would be obvious to the skilled person, when reading this document.

It is further contemplated that in many cases the bias circuit 321,322; 521,522; 721,722; 821,822 can be adapted to deliver substantially the same bias current to the sensor structure without the aid of the one or more capacitors C1, C2. This is for instance possible in the embodiments of FIG. 5(a) and FIG. 7(a) by removing the capacitors C1, C2 and replacing these by a short-circuit interconnection. Since the total charge Qbias only varies slowly (since it is caused by slow drift processes like change in temperature and/or stress), it is often not necessary to measure Qbias within each interval T during which averaging and/or integration of the differential output signal is done. Instead, the value of Qbias only needs to be measured once in a while (for example every 10 measurements, or every 100 measurements, etc.), and the measured value Qbias can then be reused (e.g. 9 times or 99 times, etc).

It is further contemplated that the implementation of the bias circuit 321,322; 521,522; 721,722; 821,822 and/or readout circuit 330;530;730;830 may include the use of well-known circuit techniques that reduce the impact of switching events, such as for instance the use of dummy switches for reducing charge injection, advancing or delaying the operation of switches relative to each other (e.g. for reducing signal-dependent charge injection), guard-banding (zero-banding) signals during a fraction of the time after switching (for allowing signals to settle), etc.

The invention claimed is:

1. A method of biasing a resistive sensor structure and of obtaining a sensor readout signal or sensor readout value from said sensor structure, the resistive sensor structure comprising two excitation nodes and two readout nodes, the two readout nodes being different from the two excitation nodes, and being adapted for providing a momentary readout signal at its readout nodes when being biased at its excitation nodes by a biasing circuit, the method comprising the steps of:

a) setting or measuring or detecting a first state of a first capacitor, the first state corresponding to a first amount of charge;

b) biasing the resistive sensor structure by means of a biasing circuit comprising said first capacitor so as to allow or to force a biasing current through said first capacitor and through said resistive sensor structure during a first time interval;

c) determining or measuring or detecting a second state of the first capacitor at the end of the first time interval, the second state corresponding to a second amount of charge;

d) integrating or averaging the momentary readout signal over the readout nodes during a second time interval having a predefined relation with respect to the first time interval, thereby obtaining an integrated or averaged readout signal;

e) determining the sensor readout signal or the sensor readout value based on the integrated or averaged readout signal and on a change in state of at least the first capacitor wherein the change in state is related to the difference in charge between the first state and the second state of at least the first capacitor C1.

2. A method according to claim 1, wherein the first time interval coincides with the second time interval; or
wherein the first time interval and the second time interval have a same duration but a start of the second time interval occurs later than an end of the first time interval; or
wherein a ratio of the second duration and the first duration is a predefined integer value larger than 1, and wherein step e) comprises determining the sensor readout signal or sensor readout value further taking into account said predefined ratio.

3. A method according to claim 1, wherein the first time interval has a predefined first duration, and wherein the second time interval has a predefined second duration.

4. A method according to claim 1, wherein the first time interval has a predefined start moment but a dynamically determined end moment defined as the moment at which a voltage over the first capacitor is equal to a predefined voltage level.

5. A method of biasing a resistive sensor structure and of obtaining a sensor readout signal or sensor readout value from said sensor structure, the resistive sensor structure comprising two excitation nodes and two readout nodes, and being adapted for providing a momentary readout signal at its readout nodes when being biased at its excitation nodes by a biasing circuit, the method comprising the steps of:
 a) setting or measuring or detecting a first state of a first capacitor, the first state corresponding to a first amount of charge;
 b) biasing the resistive sensor structure by means of a biasing circuit comprising said first capacitor so as to allow or to force a biasing current through said first capacitor and through said resistive sensor structure during a first time interval;
 c) determining or measuring or detecting a second state of the first capacitor at the end of the first time interval, the second state corresponding to a second amount of charge;
 d) integrating or averaging the momentary readout signal over the readout nodes during a second time interval having a predefined relation with respect to the first time interval, thereby obtaining an integrated or averaged readout signal;
determining the sensor readout signal or the sensor readout value based on the integrated or averaged readout signal and on a change in state of at least the first capacitor wherein the change in state is related to the difference in charge between the first state and the second state of at least the first capacitor C1,
wherein step d) comprises integrating or averaging the momentary readout signal using a continuous-time integrating or a continuous-time averaging circuit;
and optionally wherein step e) comprises determining the sensor readout signal by calculating according to one of the following or equivalent formulae:

$$Vout = A \times Vi/Qbias, \text{ or}$$

$$Vout = Vout0(1 + B \times (Qbias - Qbiasref)),$$

wherein Vout is the sensor readout signal compensated for bias current drift, A is a predefined scale factor, Vi is the signal provided by the continuous-time integrating or continuous-time averaging circuit as a result of step d), Qbias is representative for the total amount of charge that has flowed through the resistive sensor structure during the second time interval, Qbiasref is representative for a predefined amount of charge that nominally flows through the resistive sensor structure during the second time interval, Vout0 is the sensor readout signal not compensated for bias drift obtained from Vi under the assumption that said predefined amount of charge has flowed through the resistive sensor structure during the second time interval, and B is a predefined compensation factor.

6. A method according to claim 5, wherein the quantity Qbias representative for the total amount of charge that has flowed through the resistive sensor structure is calculated by one of the following or equivalent formulae:

$$Qbias = (Vc1 - Vc2) \cdot Cval \cdot (T2/T1), \text{ or}$$

$$Qbias = (Vc1 - Vc2) \cdot (T2/T1), \text{ or}$$

$$Qbias = (Vc1 - Vc2),$$

wherein Vc1 is the voltage over the first capacitor at the start of the first time period, Vc2 is the voltage over the first capacitor at the end of the first time period, and Cval is a capacitance of the first capacitor, and T2 is the cumulated duration of one or more second time intervals during which the momentary readout signal is cumulatively integrated.

7. A method according to claim 5, wherein the biasing circuit furthermore comprises a second capacitor, and
wherein the biasing circuit is furthermore configured for allowing or forcing the biasing current to selectively or alternatingly flow either through said first capacitor and through the resistive structure or through said second capacitor and through the resistive structure; and
optionally wherein the Qbias representative for the total amount of charge that has flowed through the resistive sensor structure is calculated by one of the following or equivalent formulae:

$$Qbias = (Vc1 - Vc2)^* Cval1^* K + (Vc3 - Vc4)^* Cval2^* M, \text{ or}$$

$$Qbias = (Vc1 - Vc2)^* K + (Vc3 - Vc4)^* Cval2/Cval1^* M, \text{ or}$$

$$Qbias = (Vc1 - Vc2)^* Cval1/Cval2^* K + (Vc3 - Vc4)^* M, \text{ or}$$

$$Qbias = (Vc1 - Vc2)^* K + (Vc3 - Vc4)^* M, \text{ or}$$

$$Qbias = (Vc1 - Vc2) + (Vc3 - Vc4)^* M/K, \text{ or}$$

$$Qbias = (Vc1 - Vc2)^* K/M + (Vc3 - Vc4), \text{ or}$$

$$Qbias = (Vc1 - Vc2) + (Vc3 - Vc4),$$

wherein Vc1 is the voltage over the first capacitor at the start of one or more second time period, Vc2 is the voltage over the first capacitor at the end of said one or more second time period, Cval1 is a capacitance of the first capacitor, K is the number of times the momentary readout signal ($\Delta V$) is cumulatively integrated when a corresponding biasing current is flowing through the first capacitor, and wherein Vc3 is the voltage over the second capacitor at the start of one or more second time period, Vc4 is the voltage over the second capacitor at the end of said one or more second time period, Cval2 is a capacitance of the second capacitor, M is the number of times the momentary readout signal is cumulatively integrated when a corresponding biasing current is flowing through the second capacitor.

8. A device for biasing a resistive sensor structure and for obtaining a sensor readout signal or sensor readout value from said sensor structure, the resistive sensor structure including two excitation nodes and two readout nodes, the two readout nodes being different from the excitation nodes, the device comprising:

means for setting or for measuring or for detecting a first state of a first capacitor, the first state corresponding to a first amount of charge;

a biasing circuit comprising said first capacitor connected or connectable to at least one of the excitation nodes of the resistive sensor structure for allowing or forcing a biasing current to flow through said first capacitor and through said resistive sensor structure during a first time interval;

a continuous time integrator or averager having an input connected or connectable to the readout nodes of the resistive sensor structure, and being adapted for providing an output signal representative of a continuous-time integral or average of the momentary differential voltage signal over the readout nodes;

means for setting or for measuring or for detecting a second state of a first capacitor, the second state corresponding to a second amount of charge at the end of the first time interval;

a control unit adapted for controlling the biasing means such that said biasing current flows through said first capacitor and through said resistive sensor structure during a first time interval;

the control unit being further adapted for controlling the continuous time integrator integrating or averaging circuit such that said differential voltage signal is cumulatively integrated or averaged during a second time interval;

the control means being further adapted for determining the sensor readout signal or the sensor readout value based on the integrated or averaged signal and on a change in state of at least the first capacitor wherein the change in state is related to the difference in charge between the first state and the second state of at least the first capacitor.

9. The device of claim 8, further comprising:

a timer unit for determining or setting or capturing a duration of the first time interval and for determining or setting or capturing a duration of the second time interval; and or a comparator unit for determining the moment at which the second state of the first capacitor reaches a predefined value; and/or switching means for selectively connecting the first capacitor to nodes for precharging the first capacitor, and for selectively connecting the first capacitor to at least one excitation node of the resistive structure for allowing or forcing the biasing current to flow through the first capacitor and through the resistive sensor structure.

10. The device of claim 8, furthermore comprising an operational amplifier having a first input connected or connectable to a reference voltage, and having a second input operatively connected or connectable to the resistive sensor structure, and wherein the device is configurable in a mode of operation wherein the first capacitor is connected to the operational amplifier in a manner such that a current flowing through the capacitor also flows through the resistive sensor structure.

11. The device of claim 10, wherein the second input of the op-amp is operatively connected to one of the excitation nodes of the resistive sensor structure; or wherein the second input of the op-amp is operatively connected to one or both of the readout nodes of the resistive sensor structure.

12. The device of claim 10, further comprising a common mode voltage generator circuit having two inputs connected to the two readout nodes or to the two excitation nodes of the resistive sensor structure, and being adapted for generating a common-mode voltage; and wherein an input of the operational amplifier is connected to an output of the common mode voltage generator circuit.

13. The device according to claim 8, further comprising a second capacitor connected or connectable to at least one of the excitation nodes of the resistive sensor structure; and wherein the control means is further adapted for setting or for measuring a third state of the second capacitor, and for optionally measuring a fourth state of the second capacitor.

14. The device according to claim 8, wherein the continuous time integrator or averager is a circuit selected from the group consisting of:

a resettable continuous-time integrator circuit;

a continuous-time integrator or low-pass filter followed by a circuit adapted for evaluating a change of the low-pass filtered output at an end of a second time interval relative to the low-pass filtered output at a beginning of said time interval;

a single-slope integrating ADC;

a multi-slope integrating ADC;

a continuous-time sigma-delta modulator;

an integration-based low-noise amplifier;

an integration based voltage-to-time conversion circuit;

a VCO-based conversion circuit.

15. The device according to claim 8, further comprising said resistive sensor structure.

16. A method according to claim 1, wherein step d) comprises integrating or averaging the momentary readout signal using a continuous-time integrating or a continuous-time averaging circuit;

and wherein step e) comprises determining the sensor readout signal by calculating according to one of the following or equivalent formulae:

$$V\text{out}=A\times Vi/Q\text{bias, or}$$

$$V\text{out}=V\text{out}0(1+B\times(Q\text{bias}-Q\text{biasref})),$$

wherein Vout is the sensor readout signal compensated for bias current drift, A is a predefined scale factor, Vi is the signal provided by the continuous-time integrating or continuous-time averaging circuit as a result of step d), Qbias is representative for the total amount of charge that has flowed through the resistive sensor structure during the second time interval, Qbiasref is representative for a predefined amount of charge that nominally flows through the resistive sensor structure during the second time interval, Vout0 is the sensor readout signal not compensated for bias drift obtained from Vi under the assumption that said predefined amount of charge has flowed through the resistive sensor structure during the second time interval, and B is a predefined compensation factor.

17. A method according to claim 16, wherein the biasing circuit furthermore comprises a second capacitor, and wherein the biasing circuit is furthermore configured for allowing or forcing the biasing current to selectively or alternatingly flow either through said first capacitor and through the resistive structure or through said second capacitor and through the resistive structure; and wherein the Qbias representative for the total amount of charge that has flowed through the resistive sensor structure is calculated by one of the following or equivalent formulae:

$Q\text{bias}=(Vc1-Vc2)*Cval1*K+(Vc3-Vc4)*Cval2*M$, or $Q\text{bias}=(Vc1-Vc2)*K+(Vc3-Vc4)*Cval2/Cval1*M$, or $Q\text{bias}=(Vc1-Vc2)*Cval1/Cval2*K+(Vc3-Vc4)*M$, or $Q\text{bias}=(Vc1-Vc2)*K+(Vc3-Vc4)*M$, or $Q\text{bias}=(Vc1-Vc2)+(Vc3-Vc4)*M/K$, or $Q\text{bias}=(Vc1-Vc2)*K/M+(Vc3-Vc4)$, or $Q\text{bias}=(Vc1-Vc2)+(Vc3-Vc4)$, wherein Vc1 is the voltage over the first capacitor at the start of one or more second time period, Vc2 is the voltage over the first capacitor at the end of said one or more second time period, Cval1 is a capacitance of the first capacitor, K is the number of times the momentary readout signal ($\Delta V$) is cumulatively integrated when a corresponding biasing current is flowing through the first capacitor, and wherein Vc3 is the voltage over the second capacitor at the start of one or more second time period, Vc4 is the voltage over the second capacitor at the end of said one or more second time period, Cval2 is a capacitance of the second capacitor, M is the number of times the momentary readout signal is cumulatively integrated when a corresponding biasing current is flowing through the second capacitor.

18. The device according to claim 8, further comprising a second capacitor connected or connectable to at least one of the excitation nodes of the resistive sensor structure; and wherein the control means is further adapted for setting or for measuring a third state of the second capacitor, and for measuring a fourth state of the second capacitor.

19. The device according to claim 8, wherein the continuous time integrator or averager includes:

a resettable continuous-time integrator circuit;

a continuous-time integrator or low-pass filter followed by a circuit adapted for evaluating a change of the low-pass filtered output at an end of a second time interval relative to the low-pass filtered output at a beginning of said time interval;

a single-slope integrating ADC;

a multi-slope integrating ADC;

a continuous-time sigma-delta modulator;

an integration-based low-noise amplifier;

an integration based voltage-to-time conversion circuit; or a VCO-based conversion circuit.

* * * * *